(12) United States Patent
Komiyama et al.

(10) Patent No.: US 7,705,306 B2
(45) Date of Patent: Apr. 27, 2010

(54) INFRARED PHOTODETECTOR

(75) Inventors: Susumu Komiyama, Setagaya-ku (JP);
Zhenghua An, Minato-ku (JP);
Jeng-Chung Cheng, Setagaya-ku (JP)

(73) Assignee: Japan Science and Technology Agency (JP)

( * ) Notice: Subject to any disclaimer, the term of this patent is extended or adjusted under 35 U.S.C. 154(b) by 581 days.

(21) Appl. No.: 11/631,290

(22) PCT Filed: Jul. 6, 2005

(86) PCT No.: PCT/JP2005/012486

§ 371 (c)(1),
(2), (4) Date: Jan. 3, 2007

(87) PCT Pub. No.: WO2006/006469

PCT Pub. Date: Jan. 19, 2006

(65) Prior Publication Data

US 2007/0215860 A1     Sep. 20, 2007

(30) Foreign Application Priority Data

Jul. 9, 2004   (JP) .............................. 2004-203879
Dec. 20, 2004  (JP) .............................. 2004-368579

(51) Int. Cl.
*H01L 31/00* (2006.01)

(52) U.S. Cl. .................................. 250/338.1

(58) Field of Classification Search ............. 250/338.1, 250/338.4; 257/E31.001
See application file for complete search history.

(56) References Cited

U.S. PATENT DOCUMENTS 6,455,872 B1 * 9/2002 Williams et al. ............... 257/14

6,627,914 B1    9/2003 Komiyama et al.

FOREIGN PATENT DOCUMENTS

| JP | 2001-119041 | 4/2001 |
|----|-------------|--------|
| JP | 2004-214383 | 8/2004 |
| WO | WO 01/06572 A1 | 1/2001 |

OTHER PUBLICATIONS

Translation of Section V. of PCT/ISA/237 in PCT/JP2005/012486 and its transmittal forms (IB338 and IB373).
O. Astafiev et al., 'Single-photon detector in the microwave range,' Applied Physics Letters, vol. 80, No. 22, 2002, pp. 4250 to 4252.

(Continued)

*Primary Examiner*—David P Porta
*Assistant Examiner*—Marcus H Taningco
(74) *Attorney, Agent, or Firm*—Chen Yoshimura LLP

(57) ABSTRACT

An infrared photodetector that is capable of efficiently detecting single photon over an extensive range of wavelengths from several μm to several hundreds of μm and is suitable for arraying, and wherein an oscillatory electric field of a single infrared photon (37) parallel to a plane of the patch section (36) of a microstrip antenna when the photon is incident to cause the latter to resonate therewith is converted to an oscillatory electric field (38z) in a z direction, which an electron (39) in a quantum dot (24a) in its base state subband (30) is allowed to absorb, thereby being excited to a first excitation state subband (31) to tunnel through a potential barrier (32) and set free to escape into a quantum well (26) in a −z direction where it is absorbed. An electric field by ionization of the quantum dot (24a) as a result of escape of the electron (39) causes change in conductance of a point contact (26e). An ionized state continuing long, the integral of change in current (42) flowing from a source (26a) to a drain (26b) becomes a magnitude that can be detected, and sensitivity that allows detecting a single infrared photon is achieved.

13 Claims, 32 Drawing Sheets

OTHER PUBLICATIONS

Susumu Komiyama, 'En Sekigai Tain'itsu Koshi Kenshutsu,' Parity, vol. 15, No. 6, 2000, pp. 39 to 44.

Kazuhiko Hirakawa et al, 'Ryoshi Dot no Hikari Ion-ka to Kokando Sekigaiko Kenshutsu heno Oyo Godo Seika Symposium Photonic Kessho to Rhoshi Dot Koen Shiryoshu, Heisel 16 Nen, 2004, pp. 17 to 20.

B.F. Levine, 'Quantum-well infrared Photodetectors,' J. Appl. Phys. vol. 74, No. 8, Oct. 15, 1993, pp. R1 to R9.

S. Komiyama et al., 'A single-photon detector in the far-infrared range,' Nature, Vo. 403, No. 6768, pp. 405-407, Jan. 27, 2000.

International Search Report PCT/ISA/210/ in PCT/JP2005/012486.

Written Opinion PCT/ISA/237 in PCT/JP2005/012486 and its English Translation.

* cited by examiner (a)

(b)

(c)

(a)

(b) (X-X' Cross Section)

(c) (Y'-Y Cross Section)

(a)

(b) (X-X' Cross Section)

(c) (Y-Y' Cross Section)

(a)

(b)

(a)

(b) (Y'—Y Cross Section)

(a)

(b) (X—X' Cross Section)

(c) (Y'—Y Cross Section)

(a)

(b) (Y'-Y Cross Section)

(a)

(b)

(a)

(b)

INFRARED PHOTODETECTOR

TECHNICAL FIELD

The present invention relates to an infrared light measuring technique and, more particularly, to an infrared photodetector that is well suited for detecting video signals.

BACKGROUND ART

As infrared photodetectors of this type there conventionally are three kinds.

The first type is a two-dimensional quantum well infrared photodetector (QWIP) utilizing a photoconducting phenomenon that accompanies the intersubband excitation of a semiconductor two-dimensional quantum well, which has widely been known as a detector for a mid-infrared range of wavelengths around 3 microns to 20 microns in wavelength (see B. F. Levine, J. Appl. Phys. 74, R1-R81 (1993)). This detector as shown in FIG. 8 in the paper detects free electrons absorbing an infrared light and excited in two-dimensional intersubband transition as an electric current between electrodes across the two-dimensional quantum well. Because of the impracticality to detect a current by one single free electron, however, the detector is far behind the level of detecting single photon and has its sensitivity D* in the order of $10^{10}$ cmHz$^{0.5}$/W.

As the second type, a single photon detector has been proposed and put to realization for a far-infrared region of wavelengths around 100 μm (microns) to 600 μm, which uses a semiconductor quantum dot and a single-electron transistor (see Japanese Patent Laid-Open Application, JP 2001-119041 A; U.S. Pat. No. 6,627,914; S. Komiyama et al., Nature 403, p. 405 (2000); O. Astafiev et al., Appl. Phys. Lett. 80, 4250 (2002)). This detector is so configured that electrons of a semiconductor quantum dot are excited upon absorbing far-infrared photons to leave the semiconductor quantum dot polarized or ionized for a long time period and a change in potential by the polarization or ionization causes the single-electron transistor to be driven. According to this detector in which the semiconductor quantum dot remains polarized or ionized for a long time period, it is possible to detect a single far-infrared photon absorbed since integration of a change in current value of the single-electron transistor gives rise to a value that is detectable in magnitude even for one single far-infrared photon. However, this detector is a measuring device designed to aim at the millimeter wave to far-infrared range and does not operate in the mid-infrared range of wavelengths shorter than several tens of microns. To wit, this detector utilizes a transition between levels whose level distance corresponds to energy in a millimeter wave to far-infrared range such as quantum levels by the in-plane size effect, in-plane plasma vibrations or Landau levels of in-plane orbital motions, and is therefore incapable of detecting infrared lights in a range of wavelengths shorter than several tens of microns. For operation in such a range of short wavelengths as well, a detector must utilize a two-dimensional intersubband transition that is selectively brought about and it requires a new physical mechanism, new both in condensing light and in detection, and a device structure for the same to function.

As the third, there has been proposed a quantum well type detector for detecting single photon by two-dimensional intersubband transition in a semiconductor two-dimensional quantum well (see Japanese patent Laid-Open Application, JP 2004-214383 A). This detector as shown in FIG. 32(a) includes a semiconductor mesa structure 191 and a single-electron transistor 192 on the semiconductor mesa structure 191 wherein the mesa structure 191 has an electron energy barrier which is designed to have a structure as shown in FIG. 32(b). Absorbing an infrared light 190, electrons 194 in a quantum dot 193 in the semiconductor mesa structure 191 bring about an intersubband transition, escaping in a vertical direction and being absorbed in an electrode 195. An ionized state of the quantum dot 193 by escape of electrons 194 continues for a long time period, and the infrared light 190 is detected by detecting a change in the single-electron transistor current by ionized charges 196. Having the structure that a semiconductor quantum dot remains ionized for long time period by two-dimensional intersubband transition, the structure that a single-electron transistor is driven by the ionization potential and the antenna effect by the electrode of the single-electron transistor, this detector is stated to be capable of condensing an infrared light efficiently at the area of a quantum well. In the absence of means for coupling the quantum dot and electromagnetic waves to selectively bring about the two-dimensional intersubband transition, however, the detector is poor in sensitivity. Further, it is difficult to design the quantum well structure such as to set free excited electrons 194 to escape. Moreover, the structure that a single-electron transistor made of a metal or metal oxide such as Al or $Al_2O_3$ is fabricated on a quantum well formed of a substrate of a heteroepitaxial semiconductor such as of a GaAs group tends to cause a semiconductor quantum well surface during the fabrication to be oxidized and thereby to deteriorate, and is not suitable for an infrared photodetector in the form of an array which requires quite a high yield.

DISCLOSURE OF THE INVENTION

Problems to be Solved by the Invention

As discussed above, there has hitherto been no infrared photodetector which can detect a single photon efficiently over an extensive range of wavelengths from several μm to several hundreds of μm and which has a structure that can be made to be suitable for arraying.

In view of the problems mentioned above, it is accordingly an object of the present invention to provide an infrared photodetector which can detect a single photon efficiently over an extensive range of wavelengths from several μm to several hundreds of μm and which has a structure that can be made to be suitable for arraying.

Means for Solving the Problems

There is provided in accordance with the present invention an infrared photodetector having: an isolated two-dimensional electron layer electrically isolated from its surroundings for creating electrons excited upon absorbing incident infrared photons, a means for focusing the incident infrared photons upon the isolated two-dimensional electron layer, a means for setting free the electrons excited by absorbing the infrared light to escape from the isolated two-dimensional electron layer, thereby to charge the isolated two-dimensional electron layer, and a charge sensitive transistor in which current is changed when the isolated two-dimensional electron layer is charged and change in current is maintained while the isolated two-dimensional electron layer is being charged, characterized in that it further comprises a means for selectively bringing about a two-dimensional intersubband excitation for electrons in the isolated two-dimensional electron layer.

At the outset, mention is made of a detection mechanism in an infrared photodetector of the present invention. It should be noted here that while reducing the isolated two-dimensional electron layer in in-plane directional size causes the size effect to quantize its in-plane freedom of movement and to make also its in-plane kinetic energy discrete, the present invention operates as well if there is the size quantization or not and the discussion will, for the sake of simplicity, follow in disregard of the size quantization. The term "quantum dot" is defined in the present invention as a "two-dimensional electron layer which has a size that is smaller than ½ of an infrared wavelength or than 1 µm, whichever smaller and which is electrically isolated from its surroundings. The term "quantum plate" is likewise defined as a four-cornered two-dimensional electron layer which is several µm to several hundreds of µm in size and which is electrically isolated from its surroundings. In the following discussion, mention is made of mechanisms that hold both for the quantum dot and plate by taking the case of quantum dot.

Mention is first made of a mechanism that brings about an intersubband excitation selectively. Energy E(i) (where i=0, 1, 2, ...) at a site r in a two-dimensional electron system such as a quantum well, for kinetic energy Ez in a perpendicular (z) direction to a two-dimensional plane to be quantized so that subband energy takes discrete values, can be expressed by equation (1) as follows:

$$E(i)=E_x+E_y+E_i+U(r) \quad (1)$$

where Ex and Ey are kinetic energy in the two-dimensional plane and take continuous values and U(r) is electrostatic potential energy at site r. If base subband energy $E_0$ is taken as a reference point to make Eo=0 and it is set down that $\Delta E_{01}=E_1-E_0$, energy at base state (i=0) and energy at a first excitation state (i=1) can be expressed as equations (2) and (3), respectively, as follows:

$$E(0)=E_x+E_y+U(r) \quad (2)$$

$$E(1)=E_x+E_y+\Delta E_{01}+U(r) \quad (3)$$

Here, intersubband energy $\Delta E_{01}$ is determined by the thickness in the z direction of a quantum well forming the two-dimensional electron system due to the electron confinement effect in the z direction. The states of equation (2) and (3) in which movements in the x-y plane are the same and only subbands differ are created only by a difference between the states of movement in the z direction. Thus, in order to selectively bring about the intersubband excitation by electromagnetic wave absorption expressed by equation (4) as follows, it is required not only to satisfy the energy conservation law expressed by equation (5) (where h is the Planck constant and v is the frequency of an electromagnetic wave) but also that the electromagnetic wave have an oscillatory electric field component in the z direction, namely in the perpendicular direction to the two-dimensional plane.

$$E(0) \rightarrow E(1) \quad (4)$$

$$\Delta E_{01}=h\nu \quad (5)$$

However, the infrared light incident perpendicularly on the quantum dot has only its oscillatory component in a parallel direction, since the light is a transverse wave. Accordingly, the present invention is characterized by using a means whereby the infrared light incident perpendicularly on the quantum dot is focused on the isolated two-dimensional electron layer and further for creating an oscillatory electric field component for incident infrared light, perpendicular to a plane of the quantum dot, thereby selectively bringing about the intersubband excitation for electrons in the quantum dot, that is the means, e.g., in the form of a microstrip antenna laid across the quantum dot.

The microstrip antenna consists of a planar conductor broad in area and a conductor in the form of a patch mounted thereon with an intervening dielectric. When an electromagnetic wave having an oscillatory electric field parallel to a plane of the patch conductor is incident on the patch conductor, this oscillatory electric field becomes an oscillatory electric field in a direction perpendicular to the patch conductor plane, causing the patch conductor to resonate therewith (see C. A. Balanis, "Antenna Theory", Wiley, (1997), Ch. 14). Thus, by a microstrip antenna having an impedance matched with a wave impedance of an infrared light for detection, it is possible to focus the infrared light incident perpendicularly on the plane of a quantum dot to the quantum dot, to create an oscillatory electric field component perpendicular to the plane of the quantum dot and at the same time to bring about an intersubband transition selectively for electrons in the quantum dot. Since an intersubband transition can selectively be brought about for electrons in a quantum dot, an infrared light of any wavelength in an extensive range of wavelengths from several µm to several hundreds of µm can be detected.

Mention is next made of a mechanism whereby an electron excited by intersubband transition is set free from a quantum dot and a mechanism whereby an ionization brought about of the quantum dot is detected by a charge sensitive transistor.

FIG. 1 is a conceptual view illustrating a mechanism whereby an electron excited by intersubband transition is set free to escape in a direction perpendicular to a surface of a quantum dot and a mechanism whereby an ionization brought about of the quantum dot is detected by a charge sensitive transistor. An electron 2 excited in a quantum dot 1 by the intersubband transition in accordance with formulae (4) and (5) is set free to escape in the perpendicular direction (−z direction) via a tunnel barrier arranged at an undersurface of the quantum dot 1, and an ionization brought about of the quantum dot is detected by a charge sensitive transistor. As the charge sensitive transistor, use is made in the present invention of what is termed a point-contact transistor which comprises a pinch conductor section, namely a point contact 3 directly under the quantum dot 1, a source and a drain electrode 4 and 5 connected across the point contact 3, and a pair of gate electrodes 6 and 6 laid across the point contact 3 for controlling the size of the point contact 3.

Mention is next made of the point-contact transistor. The term "point contact" is used herein to mean a junction pinched to a point or spot of an area of submicron in size in which two-dimensional electrons exist in a two-dimensional electron gas that is realized in a quantum well or the like. The point-contact transistor comprises a point contact, a source and a drain electrode interconnected via the point contact and a pair of gate electrodes to control the size of the point contact. The conductance of a point-contact is well known to vary quite sensitively with an electrostatic potential and does respond quite sensitively to a unit charge placed near the point contact. Actually, it has experimentally been shown that a change by one of electrons in a quantum dot can be detected by a change in conductance of a point contact spaced adjacent at a distance of submicron to the quantum dot (see M. Field, et al., Phys. Rev. Lett. 70, 1311 (1993)). In the present invention, the ionization (decrease in electron number by one) of a quantum dot that is produced by light excitation is detected as a change in conductance of the point contact.

This infrared photodetector is so made that the structures for both electron escape and detection can be fabricated as a monolithic body from a single substrate on which a semiconductor multilayer is heteroepitaxially grown. Thus, in contrast to the structure previously proposed that utilizes a single-electron transistor made of metal for detection (see Japanese Patent Laid-Open Application, JP 2004-214383 A), it is free from the problem that during fabrication of the single-electron transistor the semiconductor quantum well may have its surface oxidized to deteriorate its quality and it is easy to fabricate.

FIG. 2 is a conceptual view illustrating a mechanism whereby an electron excited by intersubband transition is set free to escape horizontally from a quantum dot and a mechanism whereby ionization brought about of the quantum dot is detected by a charge sensitive transistor. As this construction is shown in FIG. 2, an electron 2 excited in a quantum dot 1 by the intersubband transition in accordance with formulae (4) and (5) is set free to escape laterally (in an x-y plane) as indicated by the arrow in the Figure, namely into an escape electrode 7 disposed laterally of and in a plane of the quantum dot 1. The ionization due to this escape in the quantum dot 1 is detected by charge sensitive transistor. In this Figure, likewise in FIG. 1, the charge sensitive transistor is illustrated as a point-contact transistor having a point contact disposed directly under the quantum dot 1, but alternatively may be a point-contact transistor having a point contact disposed laterally of and in the plane of the quantum dot 1 or may be a single-electron transistor.

The lateral escape mechanism is further explained in detail with reference to FIG. 3. FIG. 3(a) illustrates an excitation process α and a scattering process β for an electron absorbing an infrared light in an electron density of state (DOS) diagram for a two-dimensional quantum dot 1 where the abscissa represents the state density and the ordinate represents the electron energy and where $E_0$ represents the base subband and $E_1$ represents the first excitation subband. FIG. 3(b) illustrates the excitation process α, the scattering process β, a migration process χ and a relaxation process δ for an electron in an electron energy diagram taken in an x-axis direction. FIG. 3(c) illustrates the positions of an electron in the excitation process α, scattering process β, migration process χ and relaxation process δ, in which character 8 designates a potential barrier $U_B$ provided between the quantum dot 1 and the escape electrode 7, and hatched portions 9 diagrammatically illustrate spreads of an electron wave function.

The greater the kinetic energy Ex+Ey in the x-y plane, the higher will the escape probability in a direction in the x-y plane be. As the intersubband excitation (formula 4) does not alter Ex+Ey, however, this alone is not enough for the lateral escape of an electron. As shown in FIGS. 3(a) to 3(c), however, the present invention utilizes the fact that an electron transits to a state E'(0), where in-plane kinetic energy Ex+Ey of the base subband is large, in accordance with a quasi-elastic scattering process β (see Filin A l, Borovitskaya E S, Larionov A V "Intersubband relaxation of two-dimensional electrons in a parallel magnetic field" SEMICOND SCI TECH 13(17): 705-708 JUL 1998) which occurs in a short period of time of subpicosecond to picosecond after the intersubband excitation process α. The scattering process β occurs under the influence of random potentials or lattice vibrations (phonon scattering).

$$E(1) \rightarrow E'(0) \approx E(0) + \Delta E_{01} \quad (6)$$

where $$E(0) = Ex + Ey + U_{QD}$$

$$E'(0) = Ex' + Ey' + U_{QD} \quad (7)$$

Here, while the value of potential $U_{QD}$ that electrons in the quantum dot 1 feel varies for each of the elemental processes, it ranges between the minimum potential energy that electrons of the lowest energy in the quantum dot 1 feel and the potential energy that electrons of the Fermi level have, namely $U_{QD-bottom} < U_{QD} < U_{QD-Fermi}$. The kinetic energy in the x-y plane is increased in the scattering process β by: from formulae (6) and (7), $$(Ex' + Ey') - (Ex + Ey) = E'(0) - E(0) \approx \Delta E_{01} = h\nu \quad (8)$$

Then, if the height of potential barrier $U_B$ set up laterally of the quantum dot is controlled to be smaller than hν (where h is the Planck's constant and ν is the photon's frequency), the excited electron after the scattering process β immediately escapes over the potential barrier into the escape electrode 7 as shown with the process χ. The electron that has escaped, as shown with the process δ, quickly loses an excess kinetic energy in the escape electrode 7 and is thus prevented by the potential barrier from easily returning to the quantum dot 1. This allows the quantum dot 1 to be charged with +e (where e is a unit charge) or ionized and the ionized state to last for a long time (from several nanoseconds to several tens of seconds). This ionization is detected as a change in current of the charge sensitive transistor. However, the charge sensitive transistor is not illustrated in FIG. 3. According to this method, it is possible to easily realize a detector for a wavelength that can be selected from over an extended range since the height of potential barrier $U_B$ can simply be electrically controlled externally according to a particular wavelength for detection. As the charge sensitive transistor, use may be made of a single-electron transistor fabricated above the quantum dot or alternatively of a point-contact transistor placed laterally of or below the quantum dot as will be described later herein.

As the mechanism whereby an electron excited in the intersubband excitation process is set free to escape from the quantum dot, the infrared photodetector according to the present invention utilizes mechanism in which escaping is perpendicularly to the quantum dot or a novel mechanism in which escaping is laterally of the quantum dot. Using these mechanisms makes it possible to give rise to new degrees of freedom in the construction of an infrared photodetector and makes possible an infrared photodetector made to be suitable for arraying.

In the foregoing description, an explanation was given of an infrared photoconductor according to the present invention that uses a quantum dot as the two-dimensional electron layer electrically isolated from its surrounding.

Mention is next made of an infrared photodetector according to the present invention using a quantum plate. An infrared photodetector of the present invention using a quantum plate is like the aforementioned infrared photodetector using the quantum dot in that by a microstrip antenna configured to be laid across the quantum plate, an infrared light incident on a plane of the quantum plate is focused on the quantum plate and an oscillatory electric field component perpendicular to the quantum plate plane is created to selectively bring about an intersubband transition for electrons in the quantum plate.

FIG. 4 is a conceptual view illustrating a mechanism whereby an electron excited by the intersubband excitation process is set free to escape from a quantum plate and a mechanism whereby ionization brought about of the quantum plate is detected by a charge sensitive transistor. An electron 2 excited in a quantum plate 10 by the intersubband transition in accordance with formulae (4) and (5) is set free to escape in the perpendicular direction (−z direction) via a tunnel barrier arranged at an undersurface of the quantum plate 10, thereby bringing about an ionization of the quantum plate 10 which is detected by a charge sensitive transistor 11. The charge sensitive transistor 11 in this case comprises a two-dimensional electron layer 12 disposed directly beneath the quantum plate 10, a source and a drain electrode 13 and 14 provided at two ends of the two-dimensional electron layer 12, and a back gate electrode 15 provided below the quantum plate 10, respectively. The charge sensitive transistor 11 of this structure is herein termed "point-contact network transistor". By selecting a voltage applied to the back gate electrode 15 of the point-contact network transistor 11, two-dimensional electrons in the two-dimensional electron layer 12 are set to be placed in a state immediately prior to their depletion. In this state, the concentration of two-dimensional electrons in the two-dimensional electron layer 12 is lowered so that electron systems remain in the form of a cobweb network in which at a number of sites there are formed small dots where electrons can only tunnel and their conductance is especially small, namely point contacts. To with, in this state a number of point contacts form a network. When infrared light is incident, then a microstrip antenna (not shown) acts to selectively bring about an intersubband excitation for electrons 2 in the quantum plate 10, setting free the electrons to escape into the two-dimensional electron layer 12 and to be absorbed into the drain electrode 14, thereby ionizing the quantum plate 10. What differs with the quantum dot is that since the quantum plate 10 is larger in size than infrared wavelengths, a plurality of ionizations occur simultaneously at different sites in the quantum plate upon incidence of infrared light. If a plurality of ionized charges are formed, they cause the concentrations of electrons to increase at a number of point contacts where their conductance in the two-dimensional electron layer 12 is especially lowered, facilitate their tunneling and largely increase the conductance. Ionizations lasting for a long time period, the integration of change in current based on change in conductance over the time period gives rise to a magnitude that is detectable even for light intensity on a single photon level so that infrared light can be detected at high sensitivity. Also, this charge sensitive transistor for the infrared photodetector is easier to fabricate than those using a quantum dot as shown in FIGS. 1 and 2.

Mention is next made of specific structures for an infrared photodetector according to the present invention. Infrared photodetectors of the present invention illustrated below operate on a variety of novel mechanisms as described above.

An infrared photodetector is provided in accordance with the present invention, which may be characterized in that it comprises: an isolated two-dimensional electron layer electrically isolated from its surroundings for creating electrons excited upon absorbing incident infrared photons; a means for focusing the incident infrared photons upon the isolated two-dimensional electron layer and for creating an oscillatory electric field component for incident infrared photons, perpendicular to a plane of the isolated two-dimensional electron layer, thereby selectively bringing about a two-dimensional intersubband excitation for electrons in the isolated two-dimensional electron layer; a means for causing the electrons excited by absorbing the infrared light to escape from the isolated two-dimensional electron layer, thereby to charge the isolated two-dimensional electron layer; and a charge sensitive transistor in which current is changed when the isolated two-dimensional electron layer is charged and change in current is maintained while the isolated two-dimensional electron layer is being charged, and which has specific structure as described below.

A first specific structure of the infrared photodetector according to the present invention is characterized in that the isolated two-dimensional electron layer comprises a quantum dot; the means for selectively bringing about the two-dimensional intersubband excitation comprises a microstrip antenna laid across the quantum dot; the means to charge the isolated two-dimensional electron layer comprises a tunnel barrier layer arranged at an underside of the quantum dot and a source and a drain electrode of a point-contact transistor arranged at an underside of the tunnel barrier layer; and the charge sensitive transistor comprises said point-contact transistor.

According to this structure, since a microstrip antenna creates an oscillatory electric field of incident infrared light coincident in direction with subband excitation of the quantum dot, the subband excitation is created even on incidence of a single infrared photon. An electron is excited by the subband transition and, past a tunnel barrier layer, is absorbed in the two-dimensional electron layer, thereby ionizing the quantum dot. Since the energy level of the source and drain electrodes is set to be sufficiently lower than the energy height of the tunnel barrier layer, the probability at which the electron returns to the quantum dot is sufficiently low and the ionization duration of the quantum dot is sufficiently long. An electric field by the ionized charge of the quantum dot causes change in conductance of the point-contact transistor, and the integration of current value based on change in conductivity over the ionization duration that is sufficiently long enables even a single infrared photon incident to be detected. It should be noted here that the wavelength of an infrared light for detection can be chosen from the thickness in the z direction of the quantum well forming the quantum dot. Also, an energy height and thickness of the tunnel barrier layer according to a wavelength of an infrared light is suitably selected in accordance with the known theory.

A second specific structure of the infrared photodetector according to the present invention differs from the first structure mentioned above in that the means for setting free the excited electrons to escape from the quantum dot, thereby to charge the quantum dot comprises a gate electrode disposed laterally in an in-plane direction of the quantum dot and an escape electrode disposed laterally to the gate electrode and the charge sensitive electrode comprises a single-electron transistor arranged directly above the quantum dot.

According to this structure, with the energy level of the escape electrode set to be sufficiently lower than the electrostatic barrier of the gate electrode, the probability at which the escaping electron returns to the quantum dot is low and the ionizing duration is sufficiently long. The ionized charge causes change in conductance of the single-electron transistor and the integration of current value based on change in conductivity over the ionization duration enables even a single photon incident to be detected. An infrared photodetector according to the second structure in which an electron is set free to escape laterally is easier to fabricate for arraying to form a video signal detector.

A third specific structure of the infrared photodetector according to the present invention differs from the second structure mentioned above in that the charge sensitive transistor comprises a point-contact transistor laid laterally of said gate electrode. This structure is easier to fabricate than that with the single-electron transistor.

A fourth specific structure of the infrared photodetector according to the present invention differs from the third structure mentioned above in that the charge sensitive transistor comprises a point-contact transistor laid directly below the quantum dot. This structure is easier to fabricate than that with the single-electron transistor.

A fifth specific structure of the infrared photodetector according to the present invention differs from the first structure mentioned above in that the isolated two-dimensional electron layer is a quantum plate and the charge sensitive transistor comprises a point-contact network transistor. According to this structure in which the isolated two-dimensional electron layer electrically isolated from its surroundings for creating electrons excited upon absorbing incident infrared photons is a quantum plate that is broader in area than the quantum dot, a plurality of excited electrons can be created simultaneously at different sites in the quantum plate. Since these excited electrons fall into the two-dimensional electron layer of the point-contact network transistor and are absorbed into the drain, the probability at which these electrons return to the quantum plate is low and hence the ionization duration of the quantum plate is sufficiently long. The ionized charge of the quantum plate causes increase in conductance of the point-contact network transistor and the integration of current value based on increase in conductivity over the ionization duration enables the intensity of incident infrared light of even a single photon level to be detected. Also, the wavelength of an infrared light for detection can be chosen from the thickness of the quantum well of the two-dimensional electron layer forming the quantum plate. Further, the tunnel barrier can be adjusted according to the wavelength of an infrared light.

This structure that does not require a pair of gates electrodes whose ends are pinched with high precision required in the point-contact transistor to form a point contact, is simpler in steps of fabricating and suitable for arraying.

The isolated two-dimensional electron layer, the means to selectively bring about the two-dimensional intersubband excitation, the means to charge the two-dimensional electron layer and the two-dimensional electron layer, the tunnel barrier layer, a conductive layer and insulating layers for the charge sensitive transistor all of the above mentioned infrared photodetector can be fabricated by using a common semiconductor multilayered heteroepitaxially grown substrate. For example, a highly developed III-V group semiconductor heteroepitaxial growth technique may be used to prepare a semiconductor multilayered heteroepitaxially grown substrate in advance in which the two-dimensional electron, tunnel barrier, conductive and insulating layers needed are deposited in the order. Then, this substrate is mesa-etched to fabricate the device. This is simpler in steps of manufacture than the conventional method with high cost that requires numbers of lithographic process steps and as a result can furnish an infrared photodetector that is high in quality and low in cost.

The point-contact transistor mentioned above may comprise a two-dimensional electron layer, a gate electrode whereby an area in which two-dimensional electrons exist in the two-dimensional electron layer is pinched to a submicron size, and a source and a drain electrode connecting to a point as the said area of two-dimensional electrons existing that is to be pinched to a submicron size. In this case, an electrical conductance of the point contact is changed by electrostatic potential of a single charge in the isolated two-dimensional electron layer and the source-drain current is varied by the change of the electrical conductance.

The point-contact network transistor mentioned above may comprise a two-dimensional electron layer, a back gate electrode whereby the two-dimensional electron layer is depleted immediately prior to its depletion for forming a network constituted of point contacts as areas of two-dimensional electrons existing which are pinched to a submicron size, and a source and a drain electrode connecting to both ends of the two-dimensional electron layer, respectively. In this case, an electrical conductance of the point contact is changed by electrostatic potential of a plurality of charges in the isolated two-dimensional electron layer and the source-drain current is varied by the change of the electrical conductance.

In accordance with the present invention, infrared photodetectors as set forth above may be connected together in the form of a series array or a two-dimensional matrix, and may be used as, for example, infrared video signal detectors.

Since light in general is a transverse wave, an oscillatory electric field of infrared light incident from above on the isolated two-dimensional electron layer has essentially only its parallel (the x-y directional) component to a plane of the isolated two-dimensional electron layer and hence it brings about no subband excitation. According to the present invention, however, the oscillatory electric field of incident infrared light can be converted to a component perpendicular to the isolated two-dimensional electron layer (in the z direction) to bring about a subband excitation, and an electron excited can be set free to escape through a tunnel barrier or a potential barrier in the z or x-y direction to charge and ionize the isolated two-dimensional electron layer with +e (e: unit charge). The fact is utilized that this ionization causes a change in current passing through a charge sensitive transistor (i.e., a single-electron transistor, a point-contact transistor or a point-contact network transistor) disposed near the isolated two-dimensional electron layer is utilized. Since the excited electron set free to escape from the isolated two-dimensional electron layer loses its energy in the escape electrode and becomes difficult to return to the isolated two-dimensional electron layer, the ionized state of the isolated two-dimensional layer continues for a long time period of around 10 nanoseconds to several tens of second. As a result, change in current passing through the charge sensitive transistor is retained for the duration that the isolated two-dimensional electron layer remains ionized state. Thus, an ultrahigh sensitivity at which even a single photon can be detected is realized.

Also, since an infrared photodetector of the present invention is fabricated by mesa-etching a semiconductor multilayered heteroepitaxially grown substrate prepared in advance, a quantum well forming the isolated two-dimensional electron layer can easily be designed so as to operate over an extensive range of wavelengths from several μm to several tens of μm. Since its structure is simple, it is well suited for arraying of a detector.

EFFECTS OF THE INVENTION

An infrared photodetector according to the present invention is capable of detecting infrared light of a single photon or whose intensity is of a single photon level over an extensive range of wavelengths from several μm to several hundreds of μm, and it can be furnished as an infrared or arrayed infrared photodetector which is of low cost and high quality.

Figure 1:
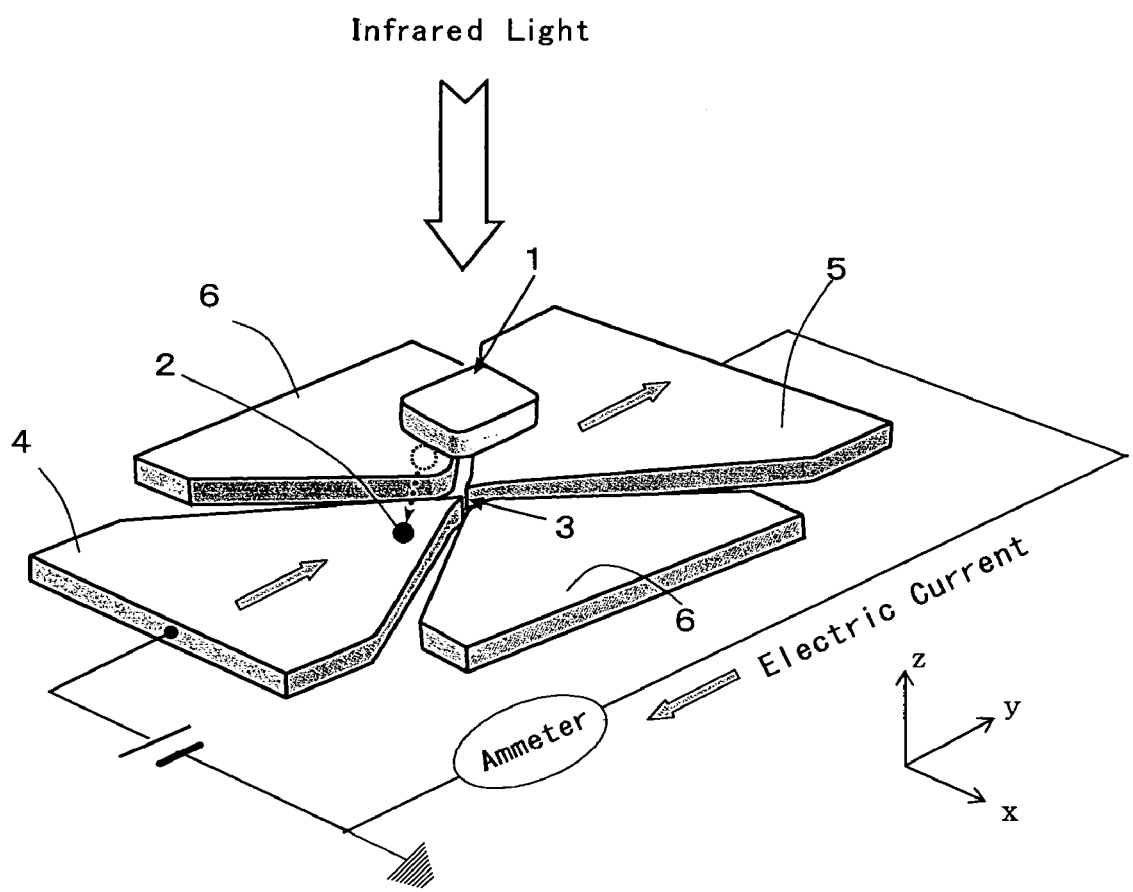
FIG. 1 is a conceptual view illustrating a mechanism by which an electron excited in an intersubband transition is set free to escape in a direction perpendicular to a surface of a quantum dot and a mechanism whereby an ionization brought about of the quantum dot is detected by a charge sensitive transistor.
Figure 2:
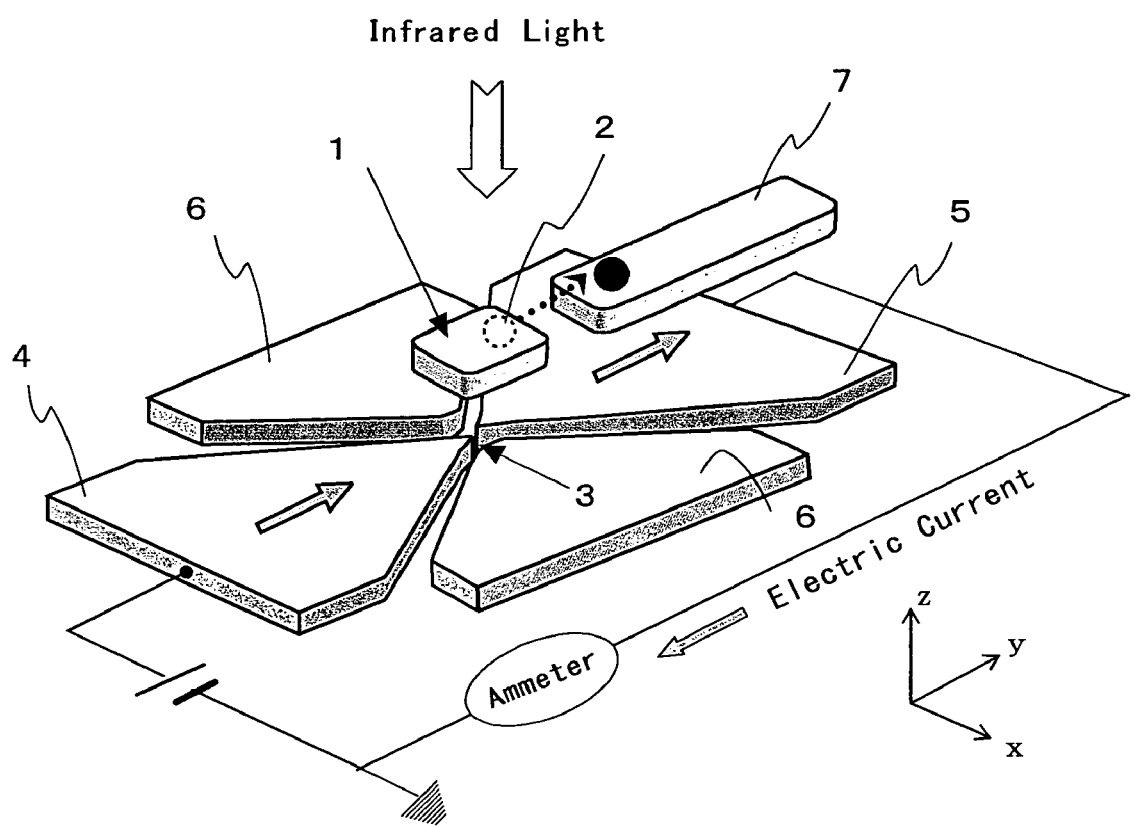
FIG. 2 is a conceptual view illustrating a mechanism whereby an electron excited in an intersubband transition is set free to escape in a horizontal direction from a quantum dot and a mechanism whereby an ionization brought about of the quantum dot is detected by a charge sensitive transistor.
Figure 3:
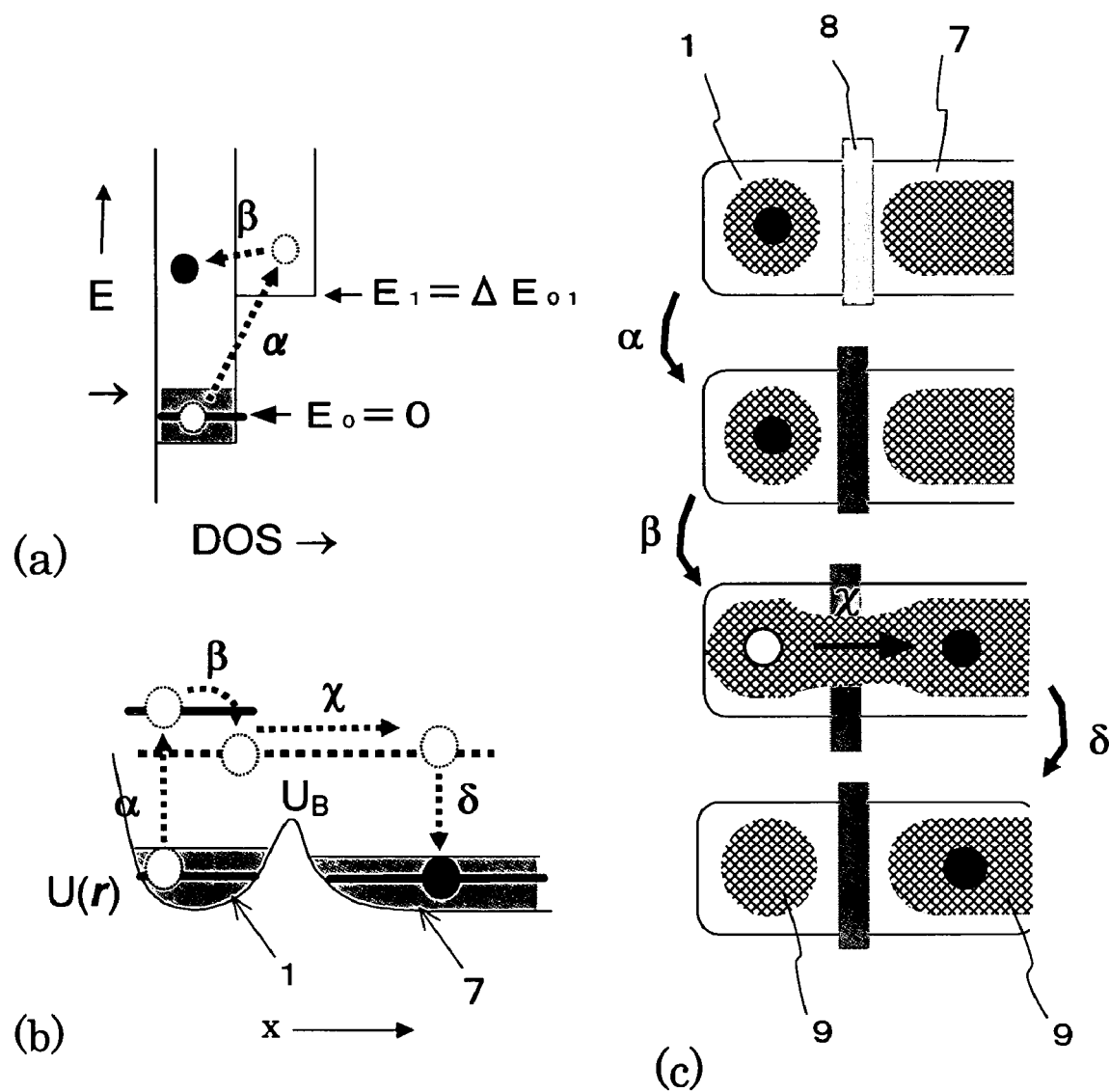
FIG. 3 shows diagrams illustrating in detail the mechanism of escape in a lateral direction.
Figure 4:
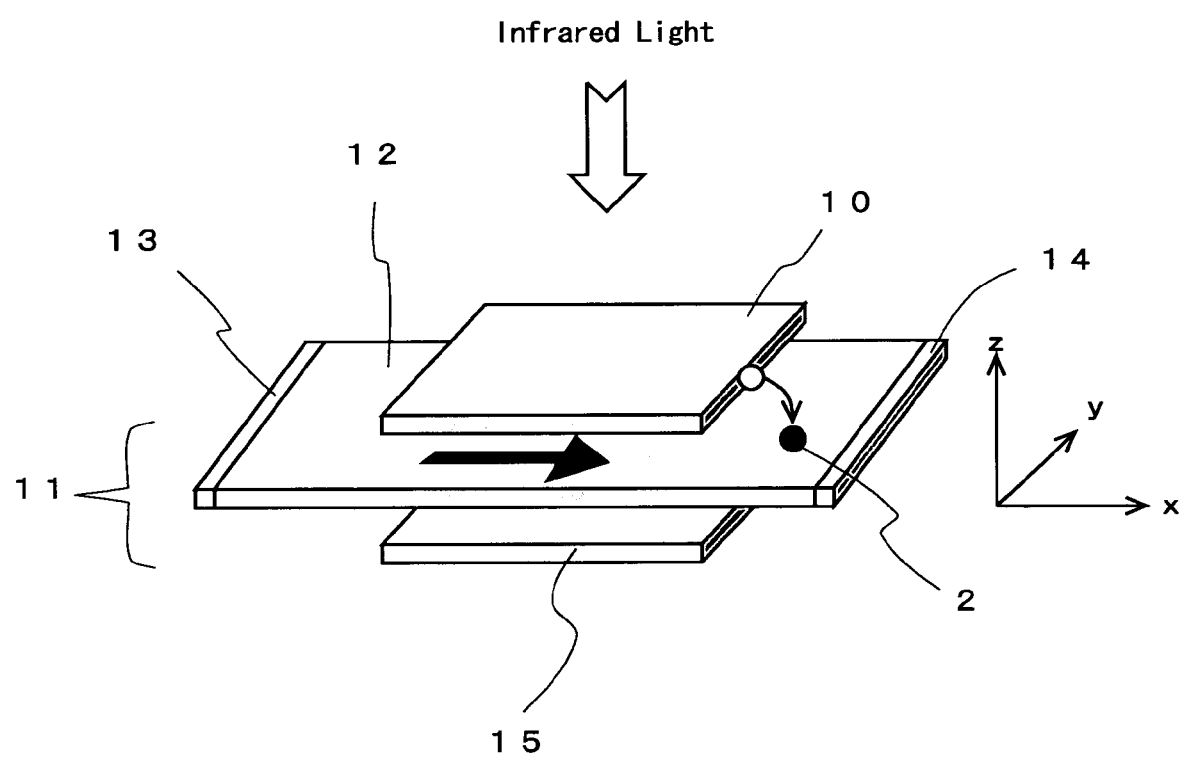
FIG. 4 is a conceptual view illustrating a mechanism whereby an electron excited in an intersubband transition is set free to escape from a quantum plate and a mechanism whereby an ionization brought about of the quantum plate is detected by a charge sensitive transistor.

DESCRIPTION OF REFERENCE CHARACTERS 1 quantum dot
2 electron
3 point contact
4 source electrode
5 drain electrode
6 side gate electrode
7 escape electrode
8 barrier layer
9 spread of wave function
10 quantum plate
11 point-contact network transistor
12 two-dimensional electron layer
13 source electrode
14 drain electrode
15 back gate electrode
20 infrared photodetector according to the first form of implementation
21 substrate
22 Si—GaAs layer
23 Si—$Al_{0.3}Ga_{0.7}As$ layer
24 two-dimensional electron layer (GaAs layer, quantum well layer)
24a quantum dot
24b side wall of quantum dot
24c escape electrode
24d source electrode
24e drain electrode
24f point contact
24g pinched area
24i pinched area
24h quantum plate
25 intermediate layer ($Al_xGa_{1-x}As$ layer)
26 two-dimensional electron layer (GaAs layer, quantum well layer)
26a source electrode
26b drain electrode
26c side gate
26d joint
26e point contact
26f two-dimensional electron layer of a point-contact network transistor
27 $Al_{0.3}Ga_{0.7}As$
28 Si—$Al_{0.3}Ga_{0.7}As$ layer
29 $Al_{0.3}Ga_{0.7}As$
30 base subband level
31 excitation subband level
32 barrier
33 upper insulating layer
34 lower insulating layer 35 mesa etching area
36 patch section
38 infrared photon
38z oscillatory electric field in z direction
39 electron
40 ionized charge (+e)
41 electric field by ionized charge
42 electric current
44 series array type infrared photodetector
46 two-dimensional array type photodetector
48 conductive layer (Si—GaAs layer)
49 substrate
50 infrared photodetector
51 substrate
52 mesa etching area
53 area fabricating an escape electrode with a quantum dot
55 quantum dot in a single-electron transistor
56 patch area (source electrode)
57 drain electrode
58 gate electrode
70 infrared photodetector
72 point-contact transistor
73 area fabricating a point-contact transistor with a quantum dot
74 patch area
75 first gate electrode
78 second gate electrode
80 infrared photodetector
81 mesa etching area
82 area fabricating an escape electrode with a quantum dot
83 mesa etching area
88 patch section
89 gate electrode
90 infrared photodetector
91 patch section
92 second gate electrode
93 first gate electrode
100 substrate
110 infrared photodetector
101 back gate electrode (n-GaAs layer)
111 metal lattice
112 ohmic contact
113 ohmic contact
114 source electrode
115 drain electrode
120 infrared photodetector
121 top gate electrode
121a depleted layer
190 infrared light
191 mesa structure
192 single-electron transistor
193 quantum dot
194 electron
195 electrode
196 ionized charge

BEST MODES FOR CARRYING OUT THE
INVENTION

Hereinafter, the present invention will be described in detail with reference to certain suitable forms of implementation thereof illustrated in the drawing figures, wherein like reference characters are used to designate substantially like members or parts.

First, an explanation is given of an infrared photodetector according to a first form of implementation of the present invention.

Figure 5:
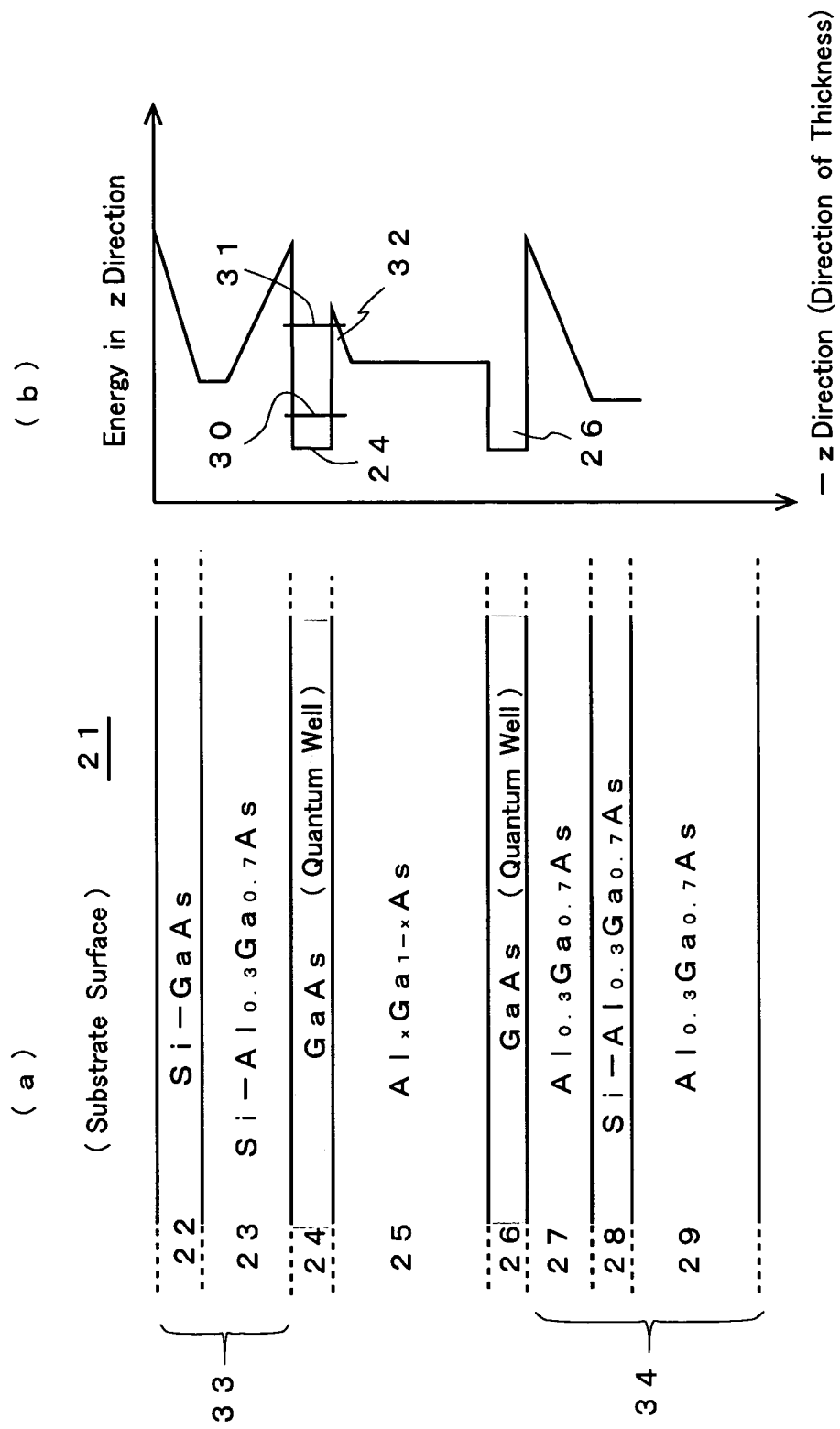
FIG. 5 diagrammatically illustrates a semiconductor multilayered heteroepitaxially grown substrate used to fabricate an infrared photodetector according to a first form of implementation of the present invention.

FIG. 5 diagrammatically shows a semiconductor multilayered heteropitaxially grown substrate 21 used to fabricate an infrared photodetector 20 according to the first form of implementation. FIG. 5(a) cross sectional diagram of the substrate 21, illustrating layers making up the substrate 21. FIG. 5(b) is an electron energy diagram formed of junctions between the layers, in which the ordinate axis is a coordinate axis taken in the direction of cross section of the substrate 21 where the −z direction is shown to represent the direction of depth of the substrate 21 and the abscissa axis represents the electron energy in a direction perpendicular to a surface of the substrate 21. As shown in FIG. 5(a), the substrate 21 used in the present invention is formed of GaAs layers, AlGaAs layers and layers of hetero junctions of III-V group compound semiconductors made of these compounds doped with impurities. Other than a combination of these III-V group compound semiconductors there may be used III-V group compound semiconductors such as GaAs, InGaAsP and others.

The GaAs layer 24 is a first two-dimensional electron layer 24 for forming a quantum dot, it makes hetero junctions with Si—$Al_{0.3}Ga_{0.7}As$ and $Al_xGa_{1-x}As$ layers 23 and 25, respectively, and it forms a quantum well. The thicknesses of the GaAs, Si—$Al_{0.3}Ga_{0.7}As$ and $Al_xGa_{1-x}As$ layers 24, 23 and 25 and the composition ratio x of the $Al_xGa_{1-x}As$ layer are suitably chosen so as to form the electron energy diagram shown in FIG. 5(b). Methods of choosing them are well known of which an explanation is omitted here. The GaAs layer 26 is a second two-dimensional electron layer 26 for forming a point-contact transistor and makes hetero junctions with $Al_xGa_{1-x}As$ 25 and $Al_{0.3}Ga_{0.7}As$ layers 27, respectively, to form a quantum well. The thicknesses of the GaAs, $Al_xGa_{1-x}As$ and $Al_{0.3}Ga_{0.7}As$ layers 26, 25 and 27 and the composition ratio x of the $Al_xGa_{1-x}As$ layer are suitably chosen so as to form the electron energy diagram shown in FIG. 5(b). Methods of choosing them are well known in the art, of which explanations are omitted here. Further, the first two-dimensional electron layer 24 is so designed that the concentration of two-dimensional electrons therein is not less than 1.5 time the concentration of two-dimensional electrons in the second two-dimensional electron layer 26 so that it is not depleted by a voltage applied to an element formed from the second two-dimensional electron layer 26 as described below.

As shown in FIG. 5(b), the electron energy diagram of the substrate 21 is so designed that when the electron at the base subband 30 is excited upon absorbing an infrared light to s first subband 31, an electron at the base subband 30 of the first two-dimensional electron layer 24 can tunnel a barrier 32 and then drop into the second two-dimensional electron layer 26. Also, the Si—GaAs layer 22, Si—$Al_{0.3}Ga_{0.7}As$ 28 and $Al_{0.3}Ga_{0.7}As$ layer 29 are used to reduce the reflectivity of infrared light and to stabilize the operation of the device, and their explanation is omitted here as they are known in the art. The substrate 21 shown in FIG. 5(a) can be fabricated by a molecular beam epitaxy method for example.

For the sake of brevity of the explanation below, the layers above the first two-dimensional layer 24 are referred to as an upper insulating layer 33, and the layers below the second two-dimensional electron layer 26 as a lower insulating layer 34. Also, components formed from the two-dimensional electron layer 24 or 26 are referred to as characters 24 or 26 followed by alphabetical letters, such 24a, 24b, . . . ; 26a, 26b, . . . .

Figure 6:
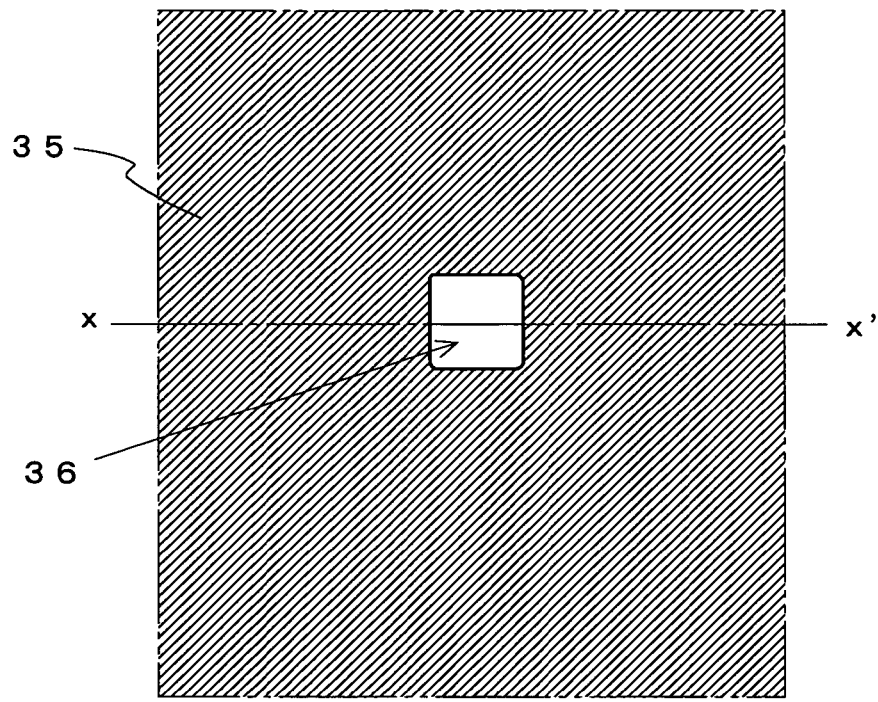
FIG. 6 illustrates a first step for fabricating an infrared photodetector according to the first form of implementation of the present invention.
Figure 6:
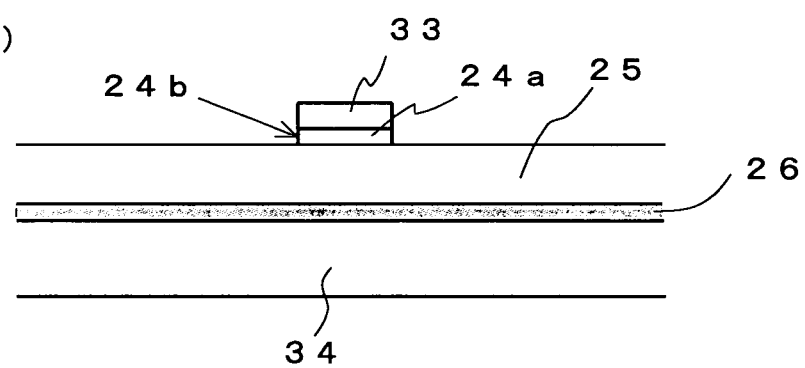
Figure 6:
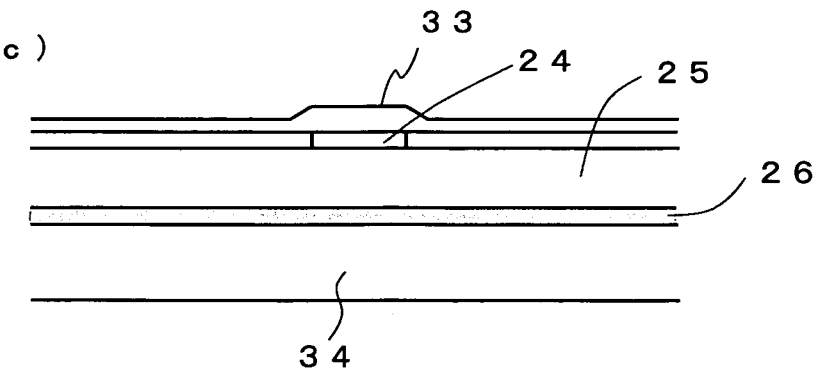

FIG. 6 shows a first step for fabricating the infrared photodetector 20 according to the first form of implementation using the substrate 21 shown in FIG. 5, in which FIG. 6(a) is a top view and FIG. 6(b) illustrates its X-X' cross sectional structure. The alternate long and two dash lines indicate a unit block of the infrared photodetector 20. The hatched area 35 in FIG. 6(a) indicates a mesa etching area and the white square area 36 indicates a mesa structure consisting of a quantum dot 24a formed from the two-dimensional electron layer 24 and an upper insulating layer 33 which are left by mesa etching. FIG. 6(b) shows mesa-etching process that the two-dimensional electron layer 24 is etched to the shape of the quantum dot 24a until the $Al_xGa_{1-x}As$ layer 25 is reached. In view of the fact that with a GaAs semiconductor, thinning the insulating layer that covers GaAs depletes free electrons in the GaAs surface, the remaining film thickness of the upper insulating layer 33 may be controlled in the mesa-etching as shown in FIG. 6(c) to form the shape of the quantum dot 24a. Also, while in FIG. 6(b) the quantum dot 24a is shown as a square uniformly shaded with a gray color, the concentration of two-dimensional electrons is not uniform in the square with electrons depleted to a given depth from the side wall 24b inward of the square. For the sake of clarity, such deletion is not shown. Also, while for the sake of clarity of the later explanation, the GaAs layer is shown only as mechanically separated or shaved off to form the shape of a quantum dot, it is also possible, of course, to delete it while controlling the remaining film thickness of the upper insulating layer as mentioned above. Further, the mesa etching can be formed by the standard photolithography technique.

A detectable infrared wavelength can be designed from 10 μm to around 80 μm by the thickness of the quantum dot 24a, namely, by suitably selecting the thickness d of the two-dimensional electron layer 24 made of GaAs. The relationship between the thickness d and the wavelength can be obtained by known formula of calculation. For example, in case $\lambda=9.6$ μm, the assumption that $d=8$ nm gives rise to a subband energy difference $\Delta E_{01}=140$ meV ($=hc/9.6$ μm where c is the speed of light). The size of the quantum dot 24a is preferably a square with a side ranging from 0.3 μm to 2 μm so that when it is ionized, a change in its electrostatic potential that exerts influence upon the point contact is sufficiently large.

Figure 7:
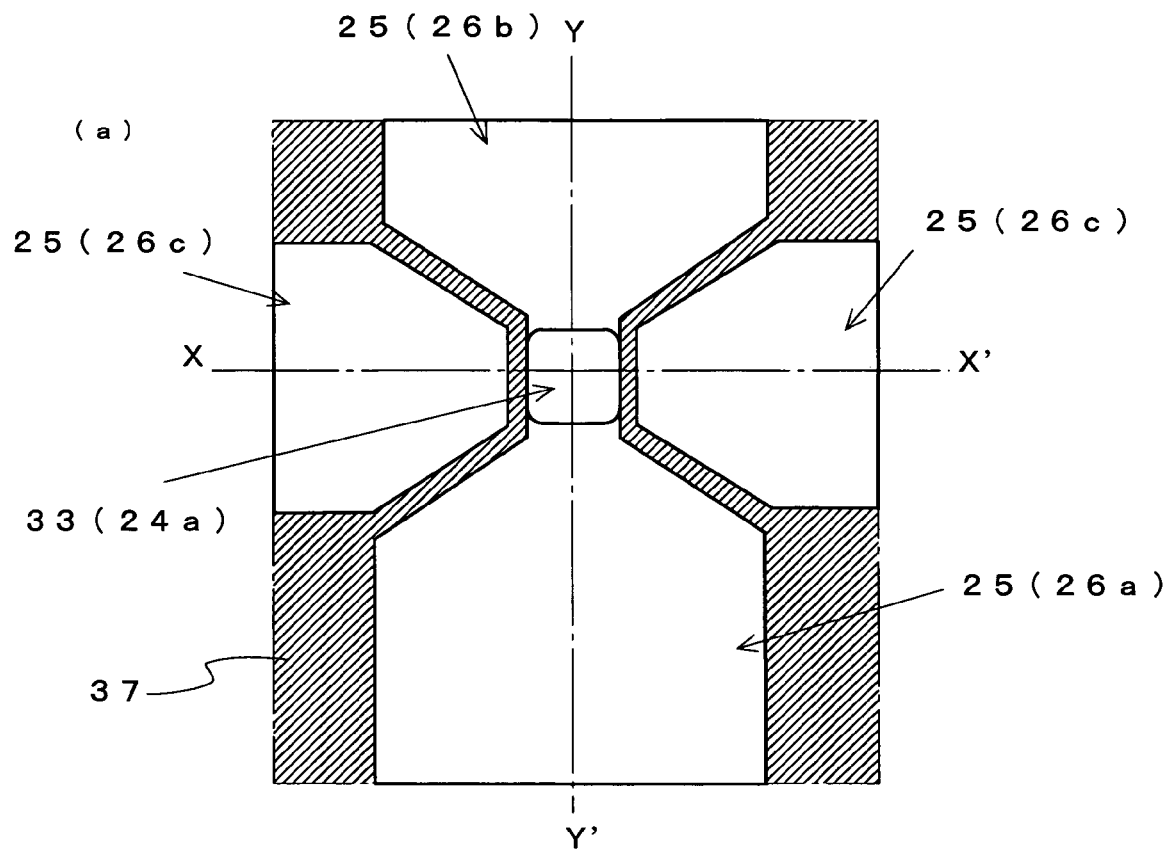
FIG. 7 illustrates a step that follows the step in FIG. 6
Figure 7:
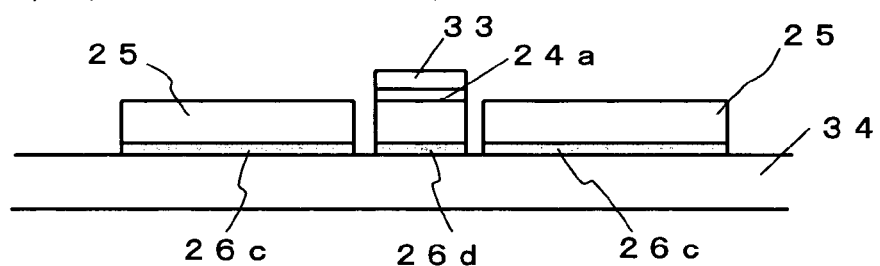
Figure 7:
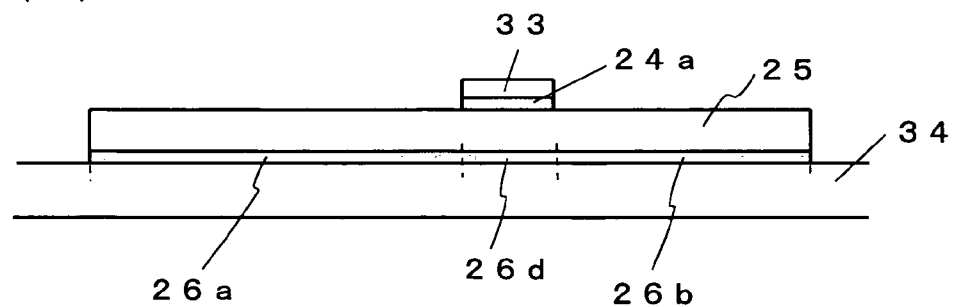

FIG. 7 shows a step that follows the step in FIG. 6, in which FIG. 7(a) is a top view of the substrate, and FIGS. 7(b) and 7(c) are cross sectional views of the substrate taken along the lines X-X' and Y'-Y in FIG. 7(a), respectively. In FIG. 7(a), there are shown hatched areas indicating mesa etching areas 37, reference character 33 (24a) indicating an upper insulating layer 33 on a quantum dot 24a, reference character 25 (26b) indicating an $Al_xGa_{1-x}As$ layer 25 on a drain electrode 26b, reference character 25 (26c) indicating $Al_xGa_{1-x}As$ layers 25 on side gate electrodes 26c, and reference character 25(26a) indicating an $Al_xGa_{1-x}As$ layer 25 on a source electrode 26a. As shown in FIGS. 7(b) and 7(c), mesa etching is performed until a lower insulating layer 34 is reached that the second two-dimensional electron layer 26 is to form the source electrode 26a, drain electrode 26b and a pair of side gate electrodes 26c of a point-contact transistor and a joint 26d between the source and drain electrodes 26a and 26b that comes to form a point contact.

Figure 8:
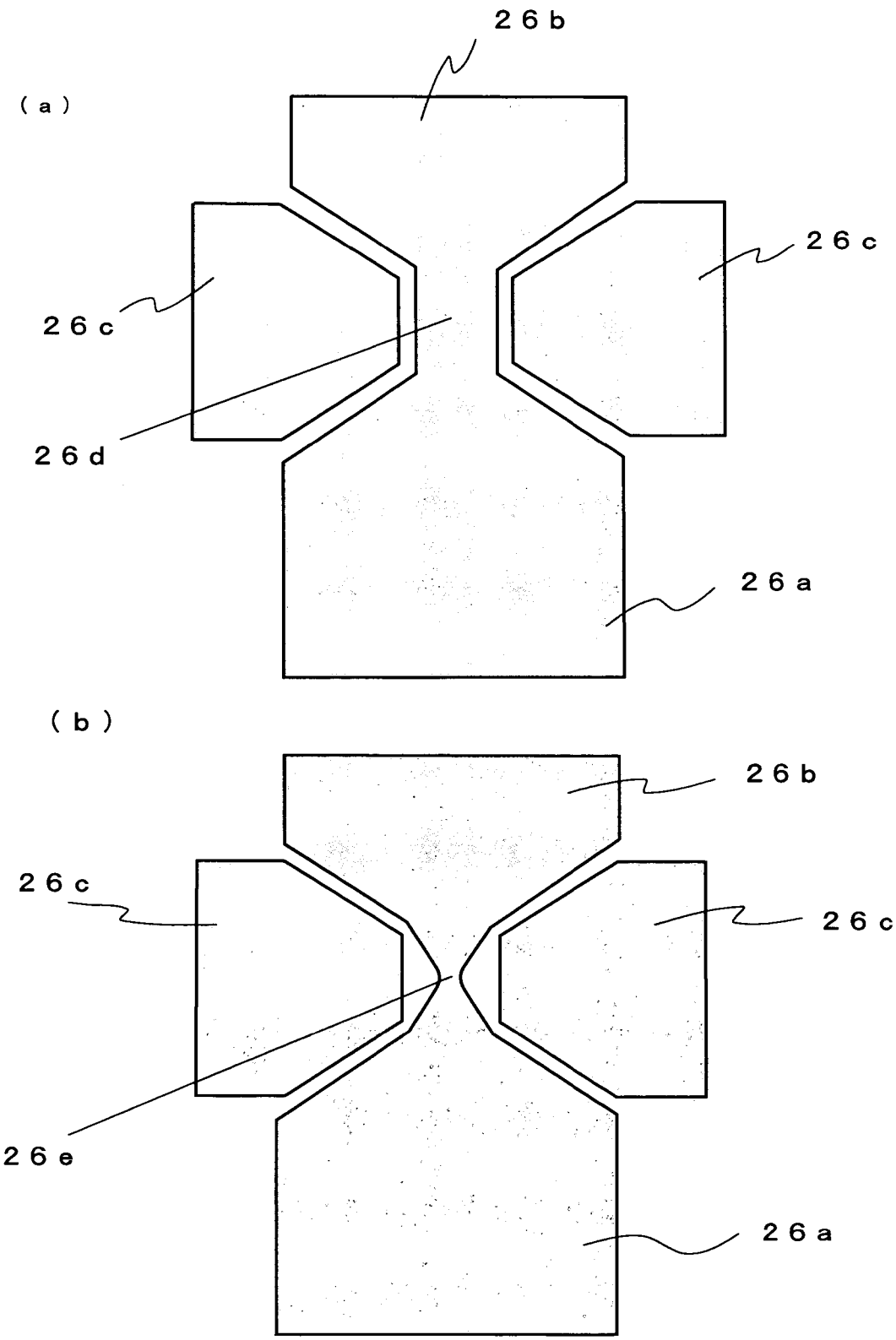
FIG. 8 illustrates upper shapes and an operation of a point contact transistor as prepared.

FIG. 8 shows upper shapes and an operation of a point contact transistor as prepared by the step shown in FIG. 7. FIG. 8(a) shows the shape viewed from above, and FIG. 8(b) shows the formation of the point contact with the side gate electrodes 26c and 26c biased negatively. As shown in FIG. 8(b), negatively biasing the side gate electrodes 26c and 26c causes the joint 26d between the source and drain electrodes 26a and 26b to be depleted, forming a point contact 26e. There lies a center of the quantum dot 24a at a position spaced directly above the point contact 26e with a spacing of 1 μm or less. Here, the connections of power supplies and others to the source, drain and side gate electrodes 26a, 26b and 26c and 26c are made by forming ohmic contacts at outsides of the frame shown by the alternate long and two short dash lines in FIG. 6(a) but are omitted from showing and further description since they are well known in the art.

Figure 9:
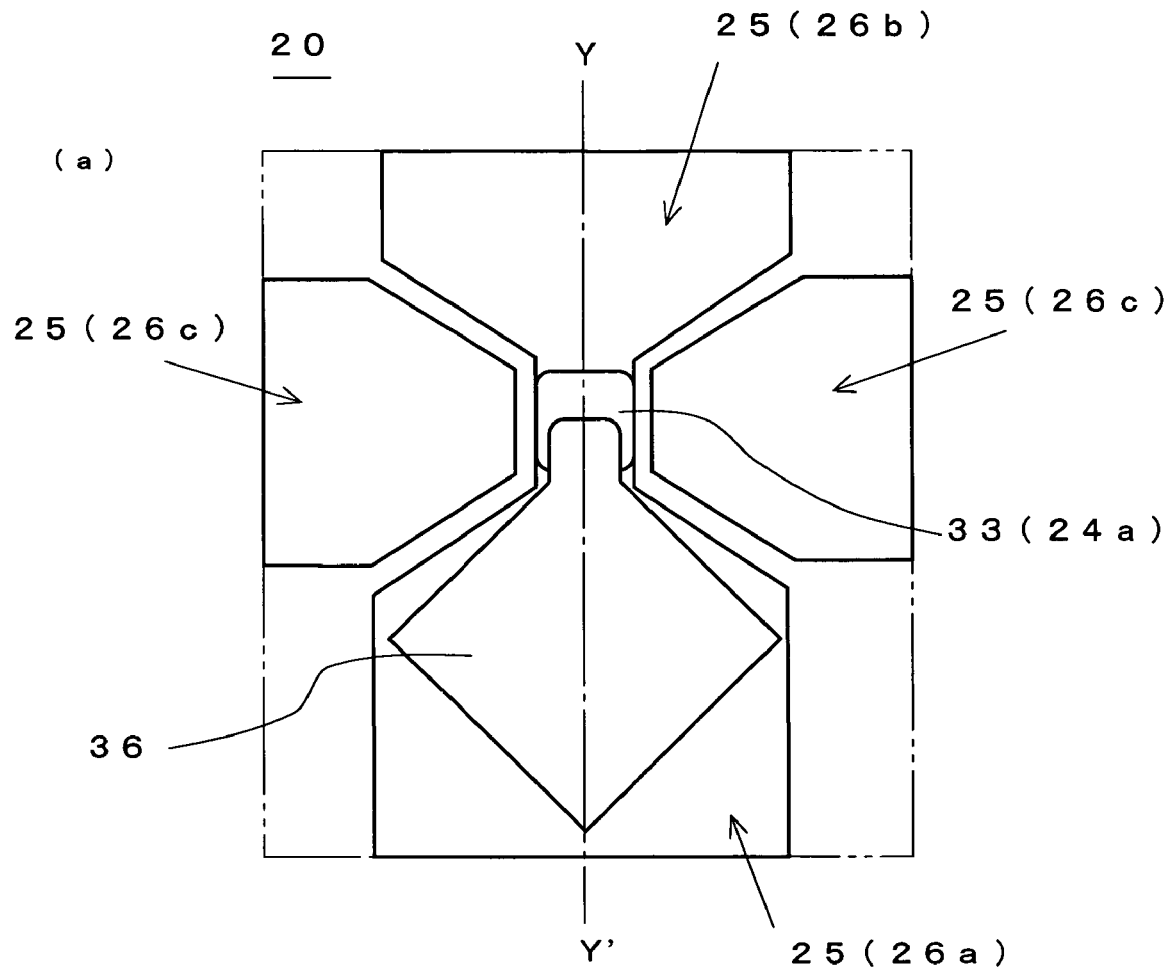
FIG. 9 illustrates a step that follows the step shown in FIG. 8.
Figure 9:
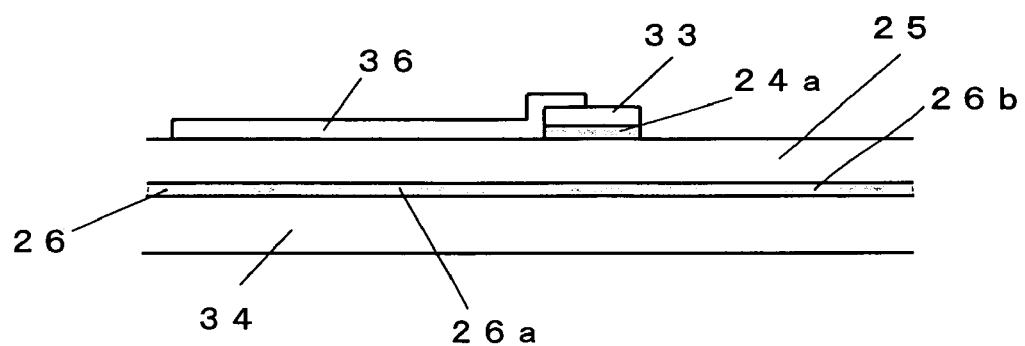

FIG. 9 shows a step that follows the step shown in FIG. 8 and illustrates how the infrared photodetector 20 according to the first form of implementation is constructed. As shown in FIG. 9(a), a patch section 36 corresponding to a patch electrode of a microstrip antenna is formed on an intermediate layer 25 (26a) on the source electrode and partly on the upper insulating layer 33 (24a) over the quantum dot. FIG. 9(b) is a cross sectional view taken along the Y-Y' line in FIG. 9(a). This step completes fabricating the infrared photodetector 20.

The patch section 36 is virtually a square and is so configured that one of its apexes extending rectangularly covers over nearly one half of the upper insulating layer 33 on the quantum dot 24a. If the square has a side length L satisfying relation: $L=\lambda\sqrt{\epsilon}/2$ where $\lambda$ is an infrared wave length for detection and $\epsilon$ is a dielectric constant of the medium, its impedance is matched to a wave impedance of the infrared wavelength for detection. In the case of GaAs, $\lambda\sqrt{\epsilon}=\lambda/3.6$. The microstrip antenna is made up of the patch section 36 together with the two-dimensional electron layer 26. The patch section 36 may be a metal such as Al for example and is formed by lift-off process or the like.

Figure 10:
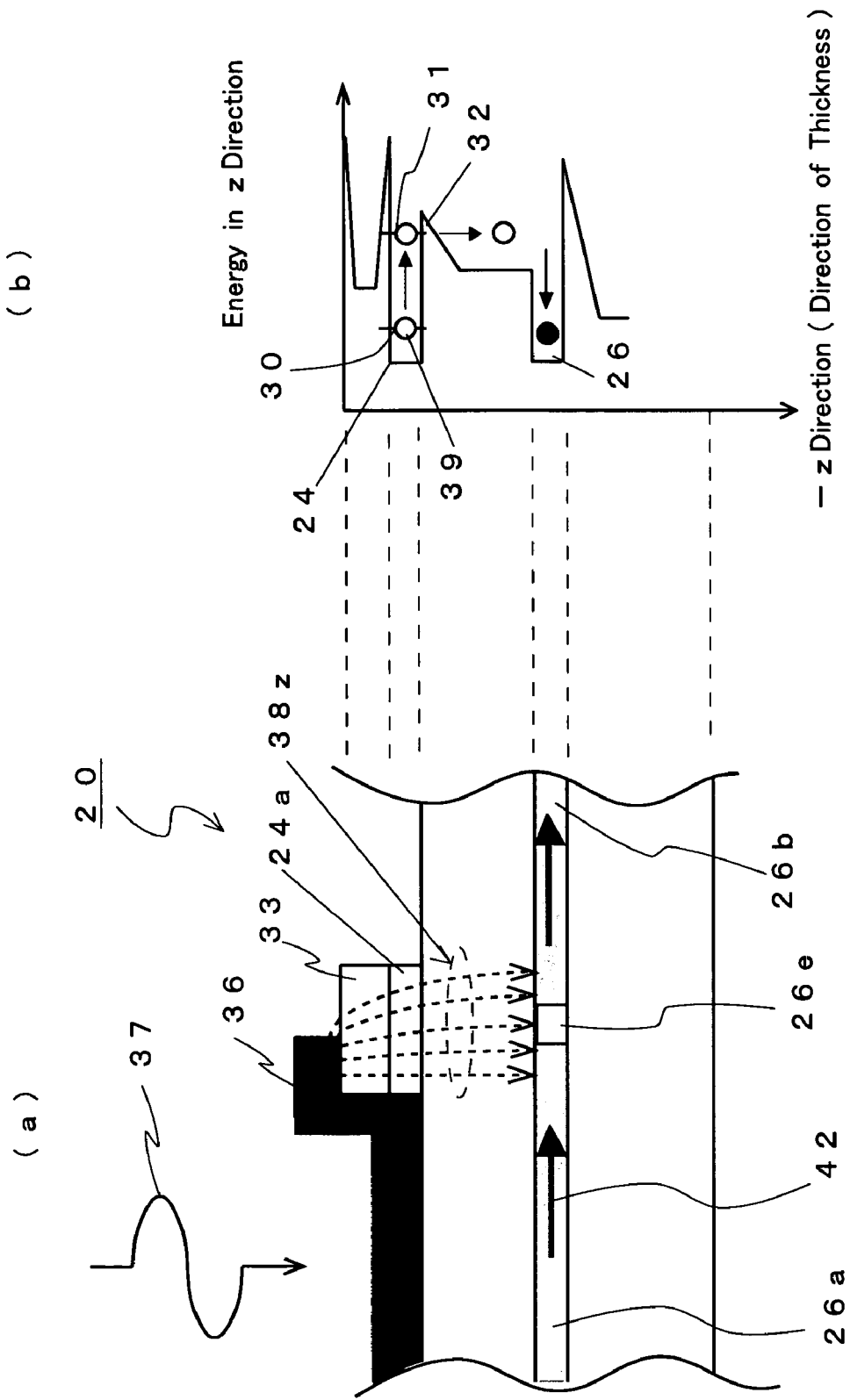
FIG. 10 diagrammatically illustrates an operation of an infrared photodetector according to the first form of implementation of the present invention.

FIG. 10 diagrammatically illustrates an operation of the infrared photodetector 20. FIG. 10(a) shows the way that when a single infrared photon 38 having an oscillatory electric field parallel to a plane of the patch section 36 is incident on the microstrip antenna to resonate therewith, the oscillatory electric field is converted into an oscillatory electric field 38z in a z direction. FIG. 10(b) shows an electron 39 in the quantum dot 24a migrating as a result of the state of FIG. 10(a). As shown in FIG. 10(b), the electron 39 that exists in a base subband 30 is excited upon absorbing the oscillatory electric field 38z in the z direction to a first excited state subband 31, then tunnels a potential barrier 32 in the −z direction, falls into the source or drain electrode 26a or 26b to lose its energy while migrating to the drain electrode 26b and is absorbed into a power supply not shown in the Figure.

Figure 11:
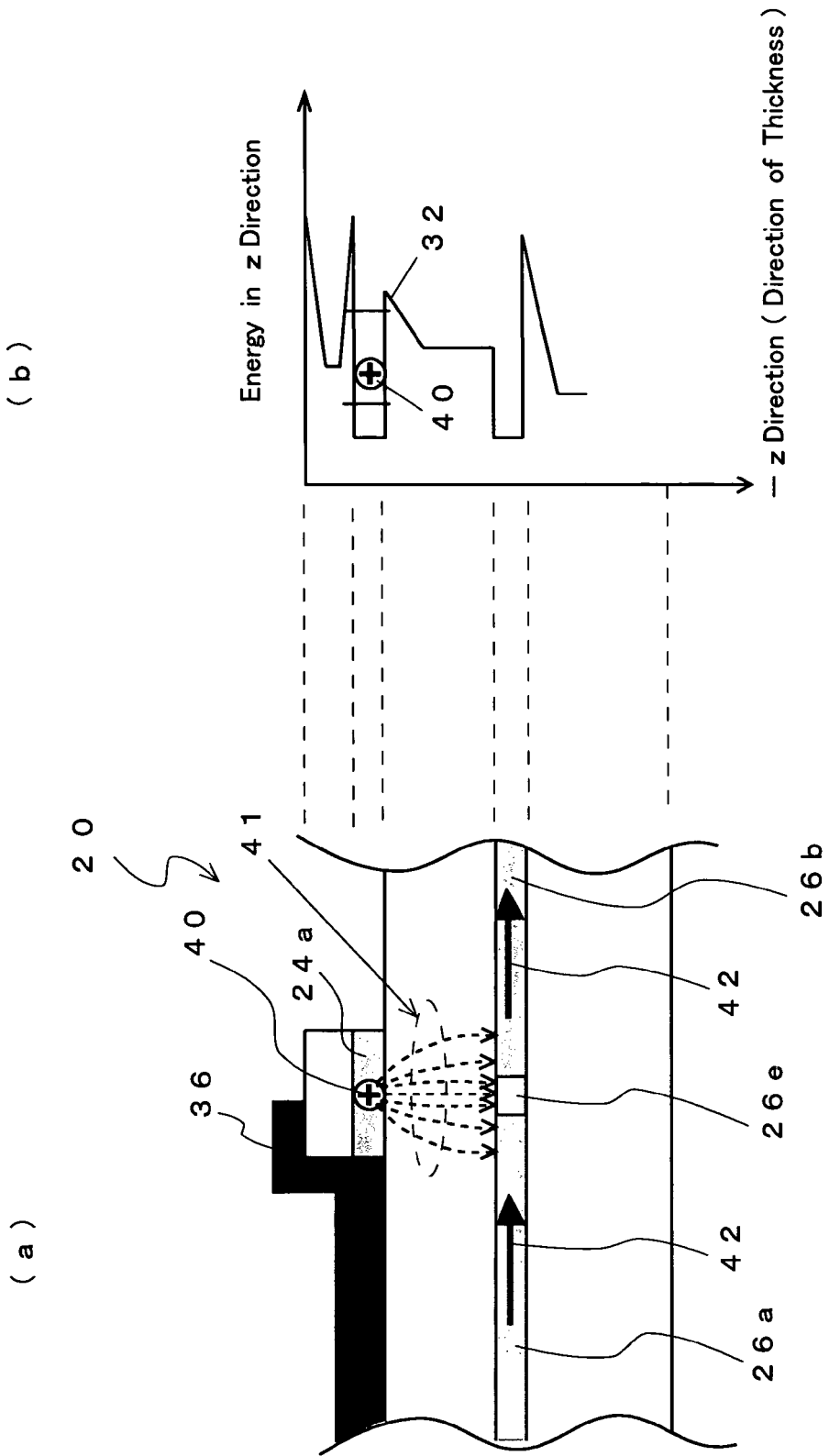
FIG. 11 illustrates an operation subsequent to that shown in FIG. 10.

FIG. 11 shows an operation subsequent to that shown in FIG. 10. FIG. 11(a) shows the state that the quantum dot 24a is ionized to produce a + charge 40 (with a magnitude of +e) when the electron 39 has escaped from the quantum dot 24a, and an electric field 41 is developed by the + charge 40. Since the point contact 26e with a negative voltage applied to the side gate electrodes 26c and 26c as shown in FIG. 8(b) is created directly under the electric field 41, the electrical conductance of the point contact 26e changes with the electric field 41. Such a change in conductance appears as a change in electric current 42 flowing from the source electrode 26a to the drain electrode 26b. As shown in FIG. 11(b), the ionization of the quantum dot 24a lasts for several nanoseconds to several tens of second until an external electron gets over the energy barrier 32 shown to recombine with the + charge 40. Changes in the current 42 for this time period can be integrated to indicate a detectable magnitude and thereby the sensitivity for detecting a single infrared photon can be obtained.

Figure 12:
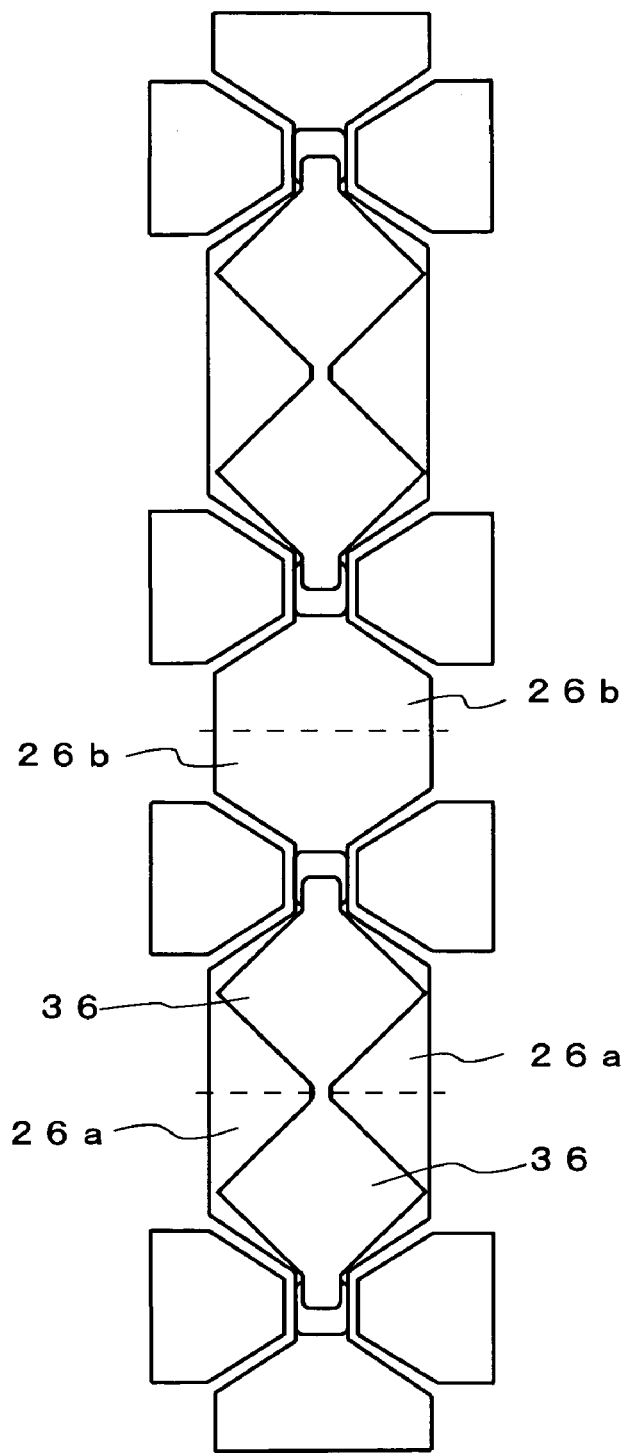
FIG. 12 illustrates how a series array type infrared photodetector can be formed using infrared photodetectors according to the first form of implementation of the present invention.

Mention is next made of a series array infrared photodetector that can be formed using an infrared photodetector 20. FIG. 12 illustrates how a series array type infrared photodetector 44 can be formed using infrared photodetectors 20 according to the first form of implementation. A series array can be formed by connecting source electrodes 26a together, patch sections 36 together and drain electrodes 26b together of adjacent blocks each enclosed with the alternate long and two dash lines in FIG. 9. The series array infrared photodetector can be manufactured very easily using the process steps same as those described in connection with FIGS. 6 to 9.

Figure 13:
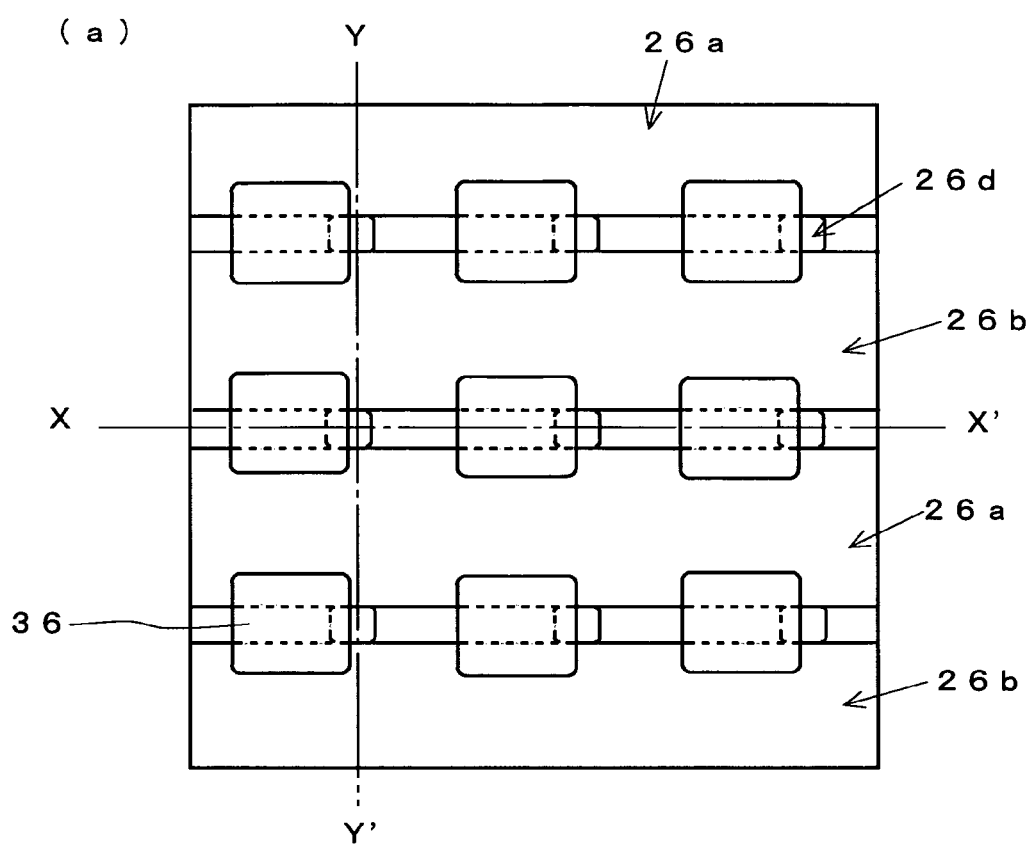
FIG. 13 illustrates how a two-dimensional array infrared photodetector can be formed using infrared photodetectors according to the first form of implementation of the present invention.
Figure 13:
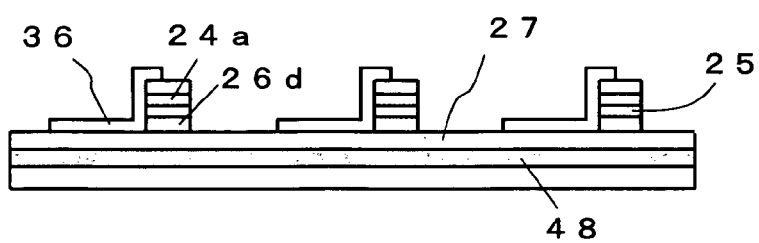
Figure 13:
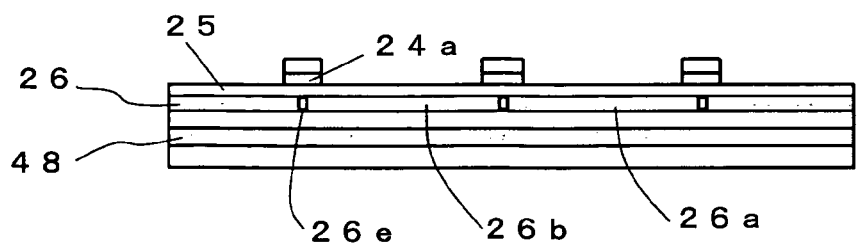
Figure 14:
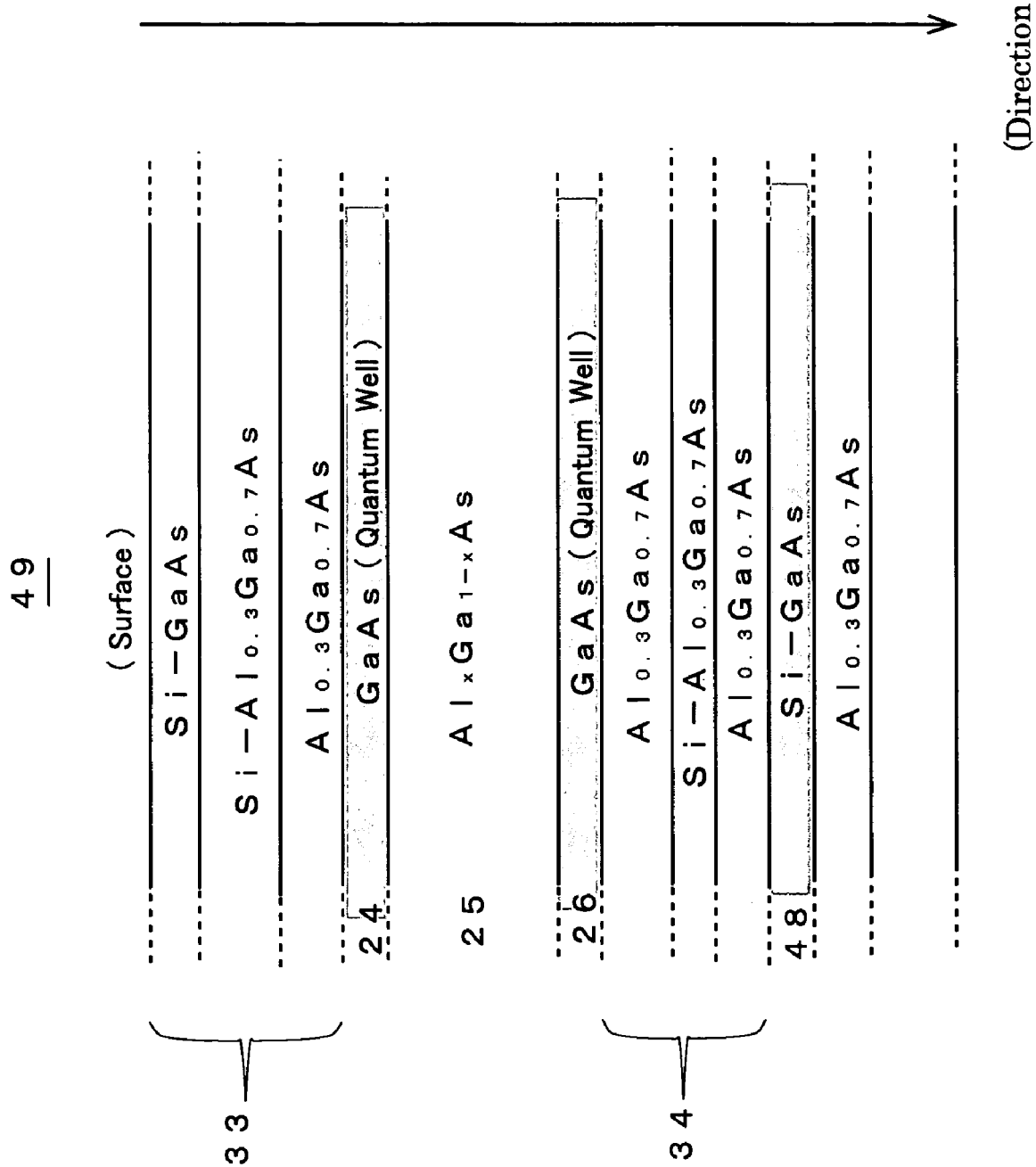
FIG. 14 illustrates a substrate for use in the two-dimensional array infrared photodetector according to the present invention.

Mention is next made of a two-dimensional array infrared photodetector that can be formed using an infrared photodetector 20. FIG. 13 shows how a two-dimensional array infrared photodetector 46 can be formed using infrared photodetectors 20 according to the first form of implementation. FIG. 13(a) is a top view thereof and FIGS. 13(b) and 13(c) are cross sectional views thereof taken along the lines X-X' and Y-Y' in FIG. 13(a), respectively. In FIG. 13 (a), the portions of point-contact transistors formed from the two-dimensional electron layer 26 is shown in gray color for the sake of clarity of the description. For fabricating the two-dimensional array infrared photodetector 46, use is made of a substrate 49 that is constructed as shown in FIG. 14. The substrate 49 differs from the point that it has a conductive layer 48 made of Si—GaAs below the second two-dimensional electron layer 26 in comparison with the substrate 21 as shown in FIG. 5.

In fabricating the two-dimensional array infrared photodetector 46, the outside of a region that becomes a quantum dot is mesa etched until an $Al_xGa_{1-x}As$ layer 25 is reached to form the quantum dot 24a. Next, adjacent quantum dots 24a regions in the x direction (white regions in FIG. 13 (a)) are mesa etched until an $Al_{0.3}Ga_{0.7}As$ layer 27 is reached. By these steps, each infrared photodetector that make up the array has a transistor structure in which drain and source electrodes 26b and 26a are connected via narrow joints 26d under quantum dots 24a, and is connected in parallel to each other in the row direction and in series with each other in the direction of columns. A patch section 36 of a microstrip antenna is formed by the lift-off process as same as described in connection with FIG. 9. The microstrip antenna is comprised by the patch section 36 and a conductive portion 48.

The operation principle of array is as same as described in connection with FIGS. 10 and 11 but differs in the method of forming point contacts 26e under the quantum dots 24a. As shown in FIG. 13(c), the point contact 26e is formed by pinching the narrow area 26d under each quantum dot 24a biased with a negative voltage around −1 volt to −5 volts. The array shown in FIG. 13 is a matrix of 3×3, which can easily be enlarged. Alternatively, a spatial resolution can be enhanced easily by forming individual infrared photodetector arrays as an independent pixel.

An explanation is next given of an infrared photodetector according to a second form of implementation of the present invention. The infrared photodetector according to the second form of implementation differs from that according to the first form of implementation in that an electron is set free to escape in an in-plane direction of a quantum dot.

Figure 15:
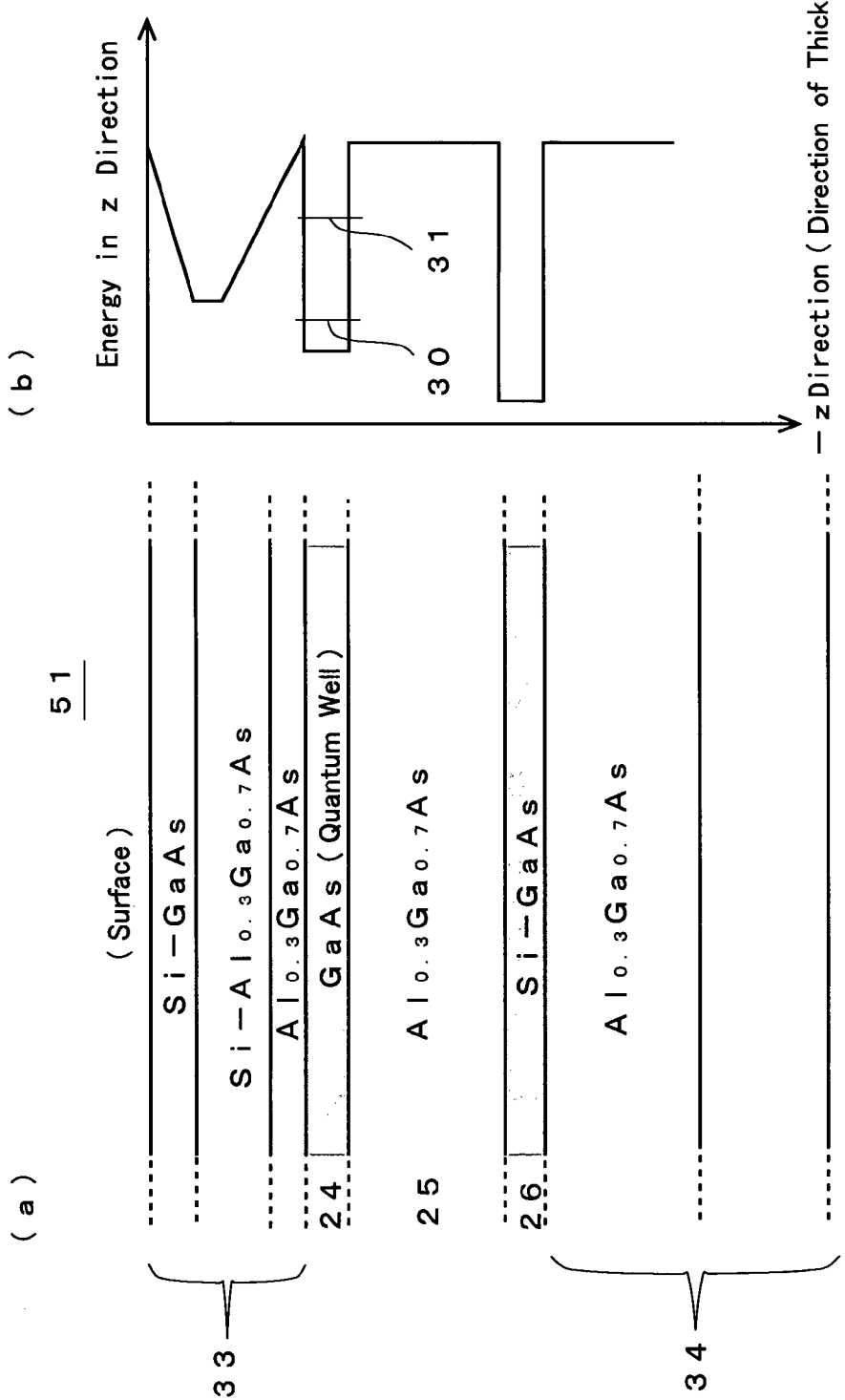
FIG. 15 diagrammatically illustrates a substrate for use in fabricating the infrared photodetector according to a second form of implementation of the present invention.

FIG. 15 diagrammatically illustrates a substrate 51 used in fabricating the infrared photodetector 50 according to the second form of implementation. FIG. 15(a) is a diagrammatic view shows the substrate 51 in its cross section, and illustrates layers that make up the substrate 51. FIG. 15(b) is an electron energy diagram formed of hetero junctions of each layers. The substrate 51 differs from the substrate 21 as shown in FIG. 5 in that the intermediate layer 25 between the first and second two-dimensional electron layers 24 and 26 is an $Al_{0.3}Ga_{0.7}As$ layer so that an electron excited to an excitation subband 31 in the z direction may not exit from the first two-dimensional electron layer 24.

Figure 16:
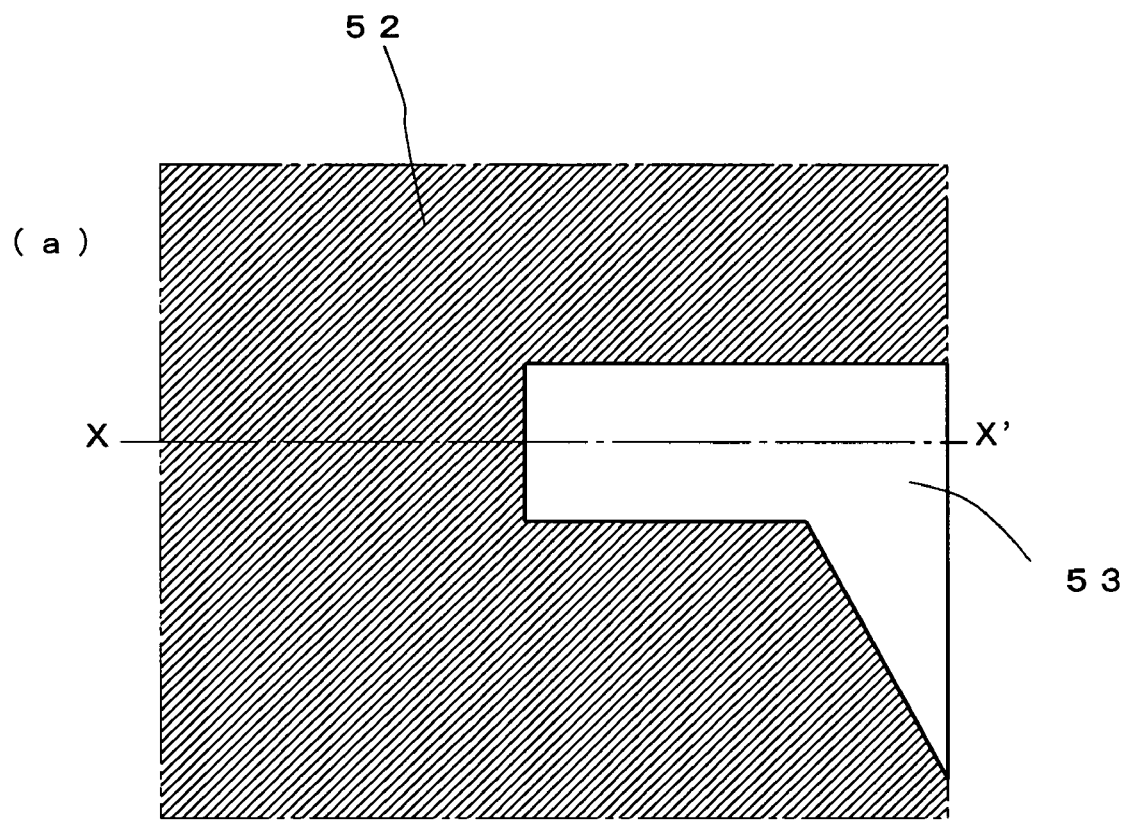
FIG. 16 illustrates a step of fabricating an infrared photodetector according to the present invention.
Figure 16:
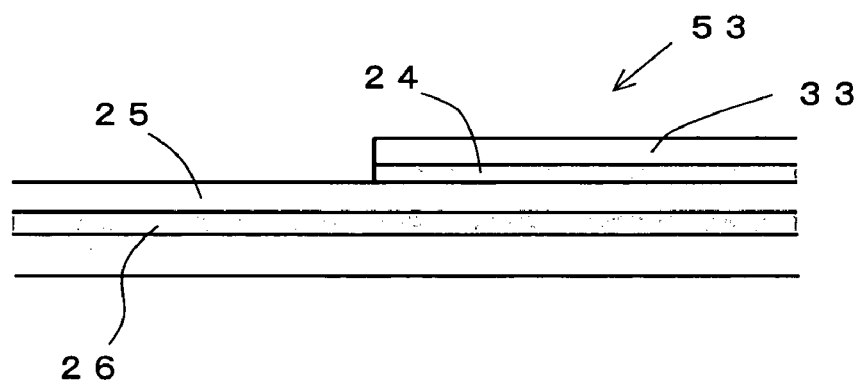

FIG. 16 illustrates a step of fabricating an infrared photodetector 50. FIG. 16(a) is a top view thereof and FIG. 16(b) is a cross sectional view thereof taken along the line x-x' in FIG. 16(a). Mesa etching initially is carried out for a hatched area 52 as shown in FIG. 16(a) until the intermediate layer 25 is reached as shown in FIG. 16(b) to form a quantum dot in the form of a square with a side of 0.3 to 1 μm and a region 53 in which an escape electrode is to be formed. Next, as shown in FIG. 17 a single-electron transistor, a patch section, and a gate electrode for forming a laterally escaping potential barrier are formed to complete fabricating the infrared photodetector 50.

Figure 17:
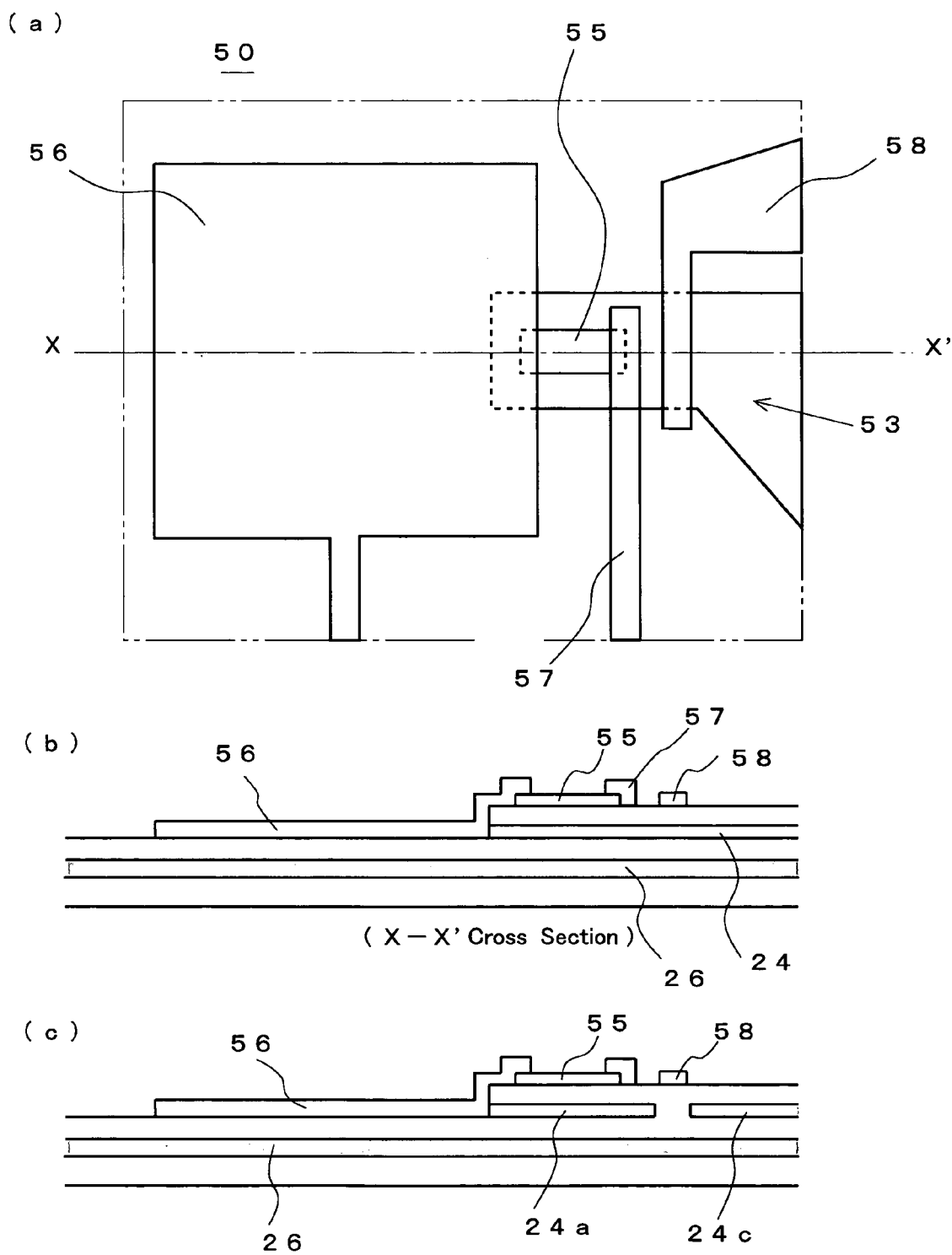
FIG. 17 illustrates how an infrared photodetector according to the present invention is made up.

FIG. 17 illustrates how the infrared photodetector 50 is made up, in which FIG. 17(a) is a top view thereof, FIG. 17(b) is a cross sectional view thereof taken along the line x-x' in FIG. 17(a) and FIG. 17(c) is a cross sectional view illustrating an operation thereof when a voltage is applied to the gate electrode. There are shown a quantum dot 55 of the single-electron transistor, a source electrode 56 of the single-electron transistor that also serves as the patch section for a microstrip antenna, a drain electrode 57 of the single-electron transistor, and the gate electrode, 58, that electrically partitions the region 53 into the quantum dot 24a and the escape electrode 24c. The single-electron transistor may, for example, be an aluminum single-electron transistor and can be made by the lift-off process of an aluminum thin film as same process of fabricating the patch section 56 and the gate electrode 58. Here, the method of fabricating a single-electron transistor is well known in the art and its explanation is omitted. Also, between the quantum dot 55 and the source electrode 56 (patch section 56) of the single-electron transistor and between the quantum dot 55 and the drain electrode 57 of the single-electron transistor there exist tunnel barrier layers made of aluminum oxide of which showing is omitted for the sake of clarity of the illustration.

A microstrip antenna patch section 56 is selected such that its one side has a length L: $L=\lambda_∈/2$ and is disposed so as to cover about ⅓ of the quantum dot 24a therewith. By biasing the gate electrode 58 with a negative voltage of about −0.4 V to −2 V to deplete the two-dimensional electron layer 24 directly below the gate electrode 58, a potential barrier $U_B$ is formed that separates the quantum dot 24a and the escape electrode 24c from each other while the quantum dot 24a is formed to be square in shape as will be apparent from FIG. 17(c). By suitably choosing the thickness d of the two-dimensional electron layer 24, the infrared wavelength λ for detection can continuously be designed from λ=10 μm (D=8 nm) to λ=200 μm (d=30 nm). The microstrip antenna is made up of the patch section 56 and the two-dimensional electron layer 26.

According to this structure, an infrared photon is incident on the microstrip antenna to cause the resonance therewith, and its oscillatory electric field of a single infrared photon is converted to an oscillatory electric field in a z direction. An electron in the quantum dot 24a is allowed to absorb the oscillatory electric field in a z direction and thereby excited to a first excitation state subband. Then, its excitation energy is converted to energy in a direction in an x-y plane under the influences of random potential or lattice vibrations, and if the energy is higher than the potential barrier $U_B$ formed by the gate electrode 58, the electron is then set free to escape into the escape electrode 24c, thereby ionizing the quantum dot 24a. An electrical conductivity of the quantum dot 55 in the single-electron transistor is varied by the ionized charge of the quantum dot 24a and the current of single-electron transistor is changed. An ionized state continuing long, the integral of change in current becomes a magnitude that can be detected, and sensitivity capable of detecting a single infrared photon can be achieved.

An explanation is next given of an infrared photodetector according to a third form of implementation of the present invention. The substrate 51 as shown in FIG. 15 is used.

Figure 18:
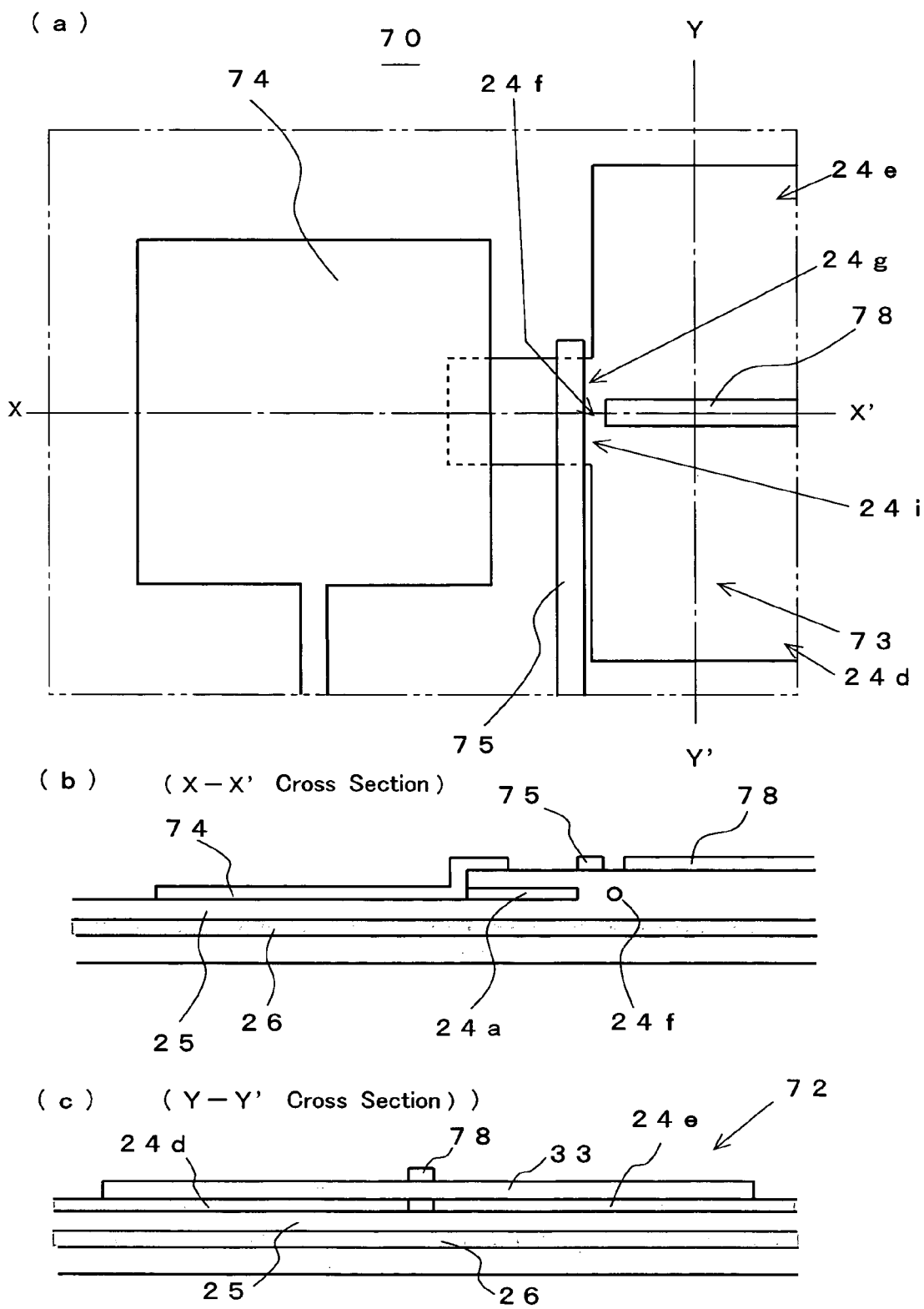
FIG. 18 illustrates the structure of an infrared photodetector according to a third form of implementation of the present invention.

FIG. 18 illustrates the structure of an infrared photodetector 70 according to the third form of implementation, in which FIG. 18(a) is a top view thereof and FIGS. 18(b) and 18(c) are cross sectional views thereof taken along the line X-X' and the line Y-Y' in FIG. 18(a), respectively. Since the structure of the infrared photodetector 70 is common in many parts to that of the infrared photodetector 50 as shown in FIG. 17, the following discussion will center on its differences from the structure of the infrared photodetector 50. While in the infrared photodetector 50 as shown in FIG. 16, mesa etching is effected until the intermediate layer 25 is first reached to form the region 53 in which the square quantum dot and the escape electrode are formed, in the infrared photodetector 70, mesa etching is carried out until the intermediate layer 25 is reached to form a region 73 in which the square quantum dot 24a and a point-contact transistor 72 are formed as shown in FIG. 18. While in the infrared photodetector 50, the patch section, the gate electrode and the single-electron transistor are formed by the lift-off process using a metallic thin film, in the infrared photodetector 70, the lift-off process by a metallic thin film is used to form a patch section 74, a first gate electrode 75 and a second gate electrode 78 for electrically dividing the region 73 to form the source and drain electrodes 24d and 24e of the point-contact transistor 72.

That the patch section 74 of the microstrip antenna is dimensioned to have one side's length L that nearly satisfies the relation: L=λ∈/2 and is arranged to cover about ⅓ of the quantum dot 24a is common to the infrared photodetector 50. That the microstrip antenna is made up of the patch section 74 and the two-dimensional electron layer 26 is common to the infrared photodetector 50. Also, that the gate electrode 75 is biased with a negative voltage to deplete the two-dimensional electron layer 24 directly under the first gate electrode 75, thereby forming the potential barrier $U_B$ that separates the quantum dot 24a and the escape electrode 24c from each other while the quantum dot 24a is formed to be square in shape is common to the infrared photodetector 50. However, it differs from the infrared photodetector 50 that in the infrared photodetector 70 the second gate electrode 78 is biased with a negative voltage to deplete the second two-dimensional electron layer 24 directly under the second gate electrode 78, thereby electrically separating the source and drain electrode 24d and 24e from each other of the point-contact transistor 72 while the joint between the source and drain electrodes 24d and 24e is pinched to form a point contact 24f as shown in FIG. 18(b). Further, the escape electrode for the infrared photodetector 70 is formed of pinched areas 24g and 241 of the source and drain electrodes 24d and 24e, which are connected to the point contact 24e.

According to this structure, an infrared photon parallel to a plane of the patch section 74 is incident on the microstrip antenna to cause the resonance therewith, and its oscillatory electric field of a single infrared photon is converted to an oscillatory electric field in a z direction. An electron in the quantum dot 24a is allowed to absorb the oscillatory electric field in a z direction and thereby excited to a first excitation state subband. Then, its excitation energy is converted to energy in a direction in an x-y plane under the influences of random potential or lattice vibrations, and if the energy is higher than the potential barrier $U_B$ formed by the first gate electrode 75, the electron is then set free to escape into the pinched areas 24g and 241, and it is absorbed into the drain electrode 24e, thereby ionizing the quantum dot 24a. An electrical conductivity of the point contact 24f is varied by the ionized charge of the quantum dot 24a and the current flowing from the source electrode 24d to the drain electrode 24e is changed. An ionized state continuing long, the integral of change in current becomes a magnitude that can be detected, and sensitivity capable of detecting a single infrared photon can be achieved.

An explanation is next given of an infrared photodetector according to a fourth form of implementation. The infrared photodetector according to the fourth form of implementation is common to that according to the third form of implementation in that an electron is set free to escape laterally (in a direction in an x-y plane) but differs from the same in that the point-contact transistor exists below the quantum dot. The substrate 49 constructed as shown in FIG. 14 is used.

Figure 19:
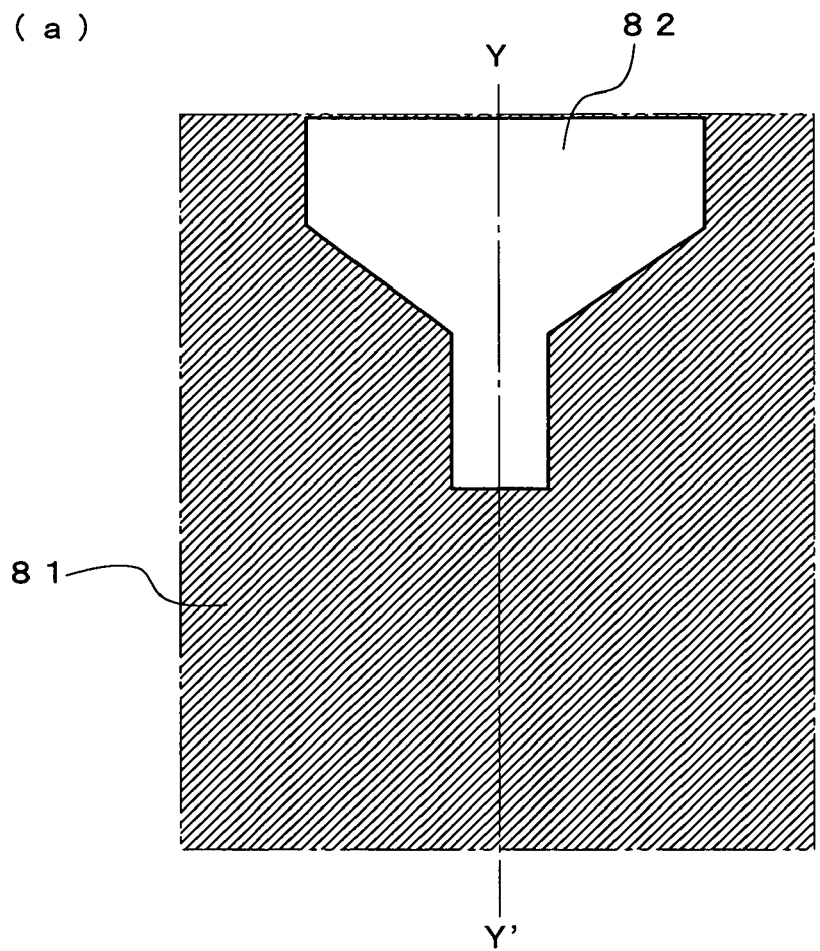
FIG. 19 illustrates a step of fabricating an infrared photodetector according to a fourth form of implementation of the present invention.
Figure 19:
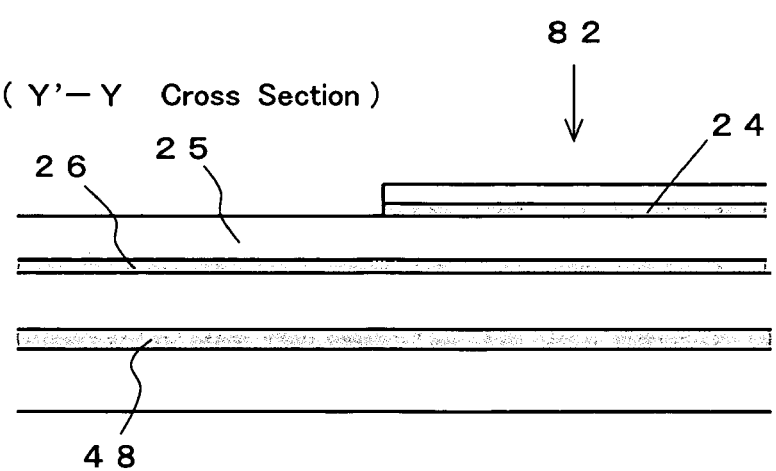

FIG. 19 illustrates a step of fabricating an infrared photodetector 80 according to the fourth form of implementation, in which FIG. 19(a) is a top view of the substrate and FIG. 19(b) is a cross sectional view of the substrate taken along the line Y'-Y. Mesa etching is carried out initially for a hatched area 81 of the substrate until the intermediate layer 25 is reached to form from the two-dimensional electron layer 24 a region 82 in which a quantum dot and an escape electrode is to be formed.

Figure 20:
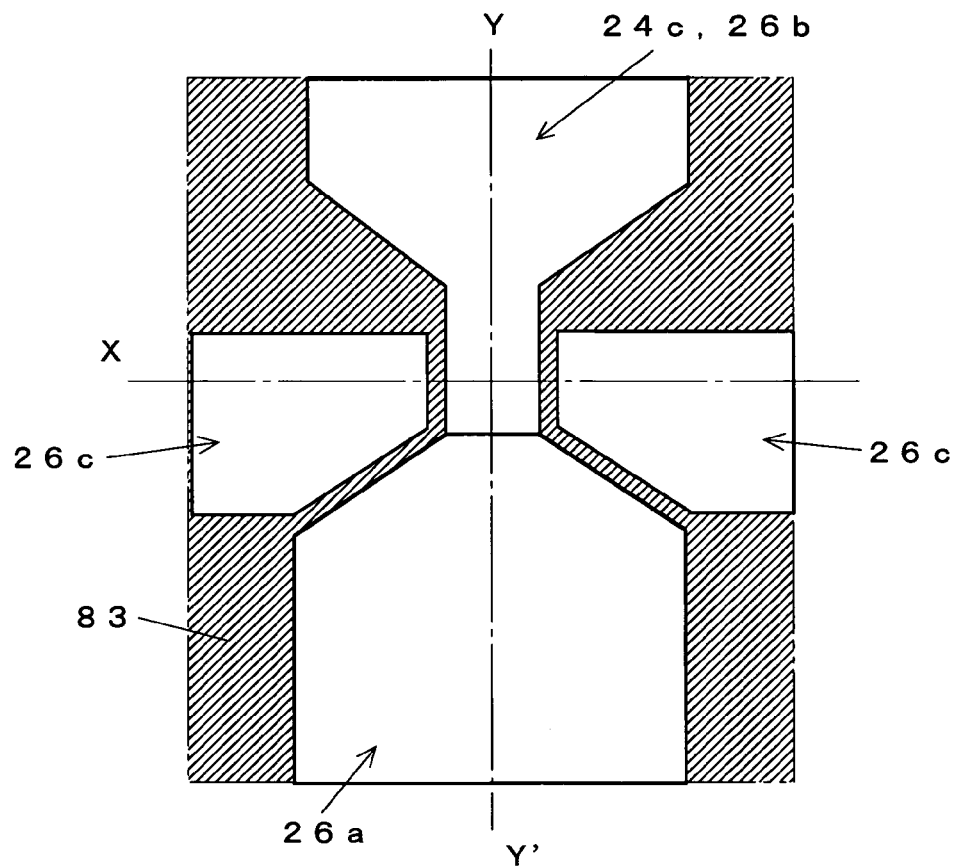
FIG. 20 illustrates a step that follows the step in FIG. 19.
Figure 20:
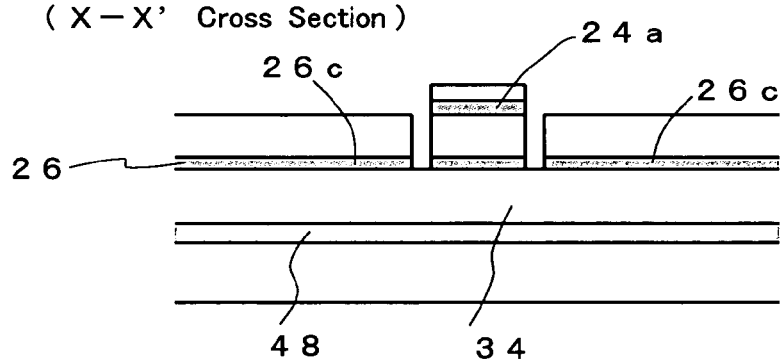
Figure 20:
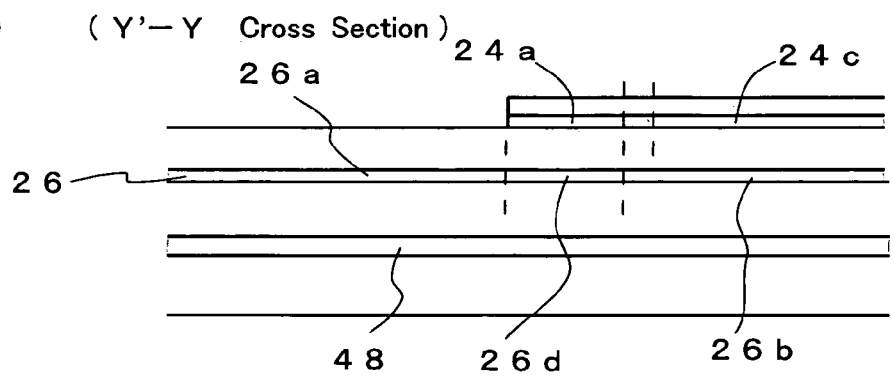

FIG. 20 shows a step that follows the step as shown in FIG. 19, in which FIG. 20(a) is a top view, and FIG. 20(b) and FIG. 20(c) are cross sectional views taken along the lines X-X' and Y'-Y in FIG. 20(a), respectively. In FIG. 20(a) there are shown as hatched mesa etching areas 83 which are formed by mesa etching from the surface of the intermediate layer 25 until the lower insulating layer 34 is reached, to form from the two-dimensional electron layer 26 a pair of side gate electrodes 26c, a source electrode 26a and a drain electrode 26b of the point-contact transistor and a joint 26d between the source and drain electrodes 26a and 26b.

Figure 21:
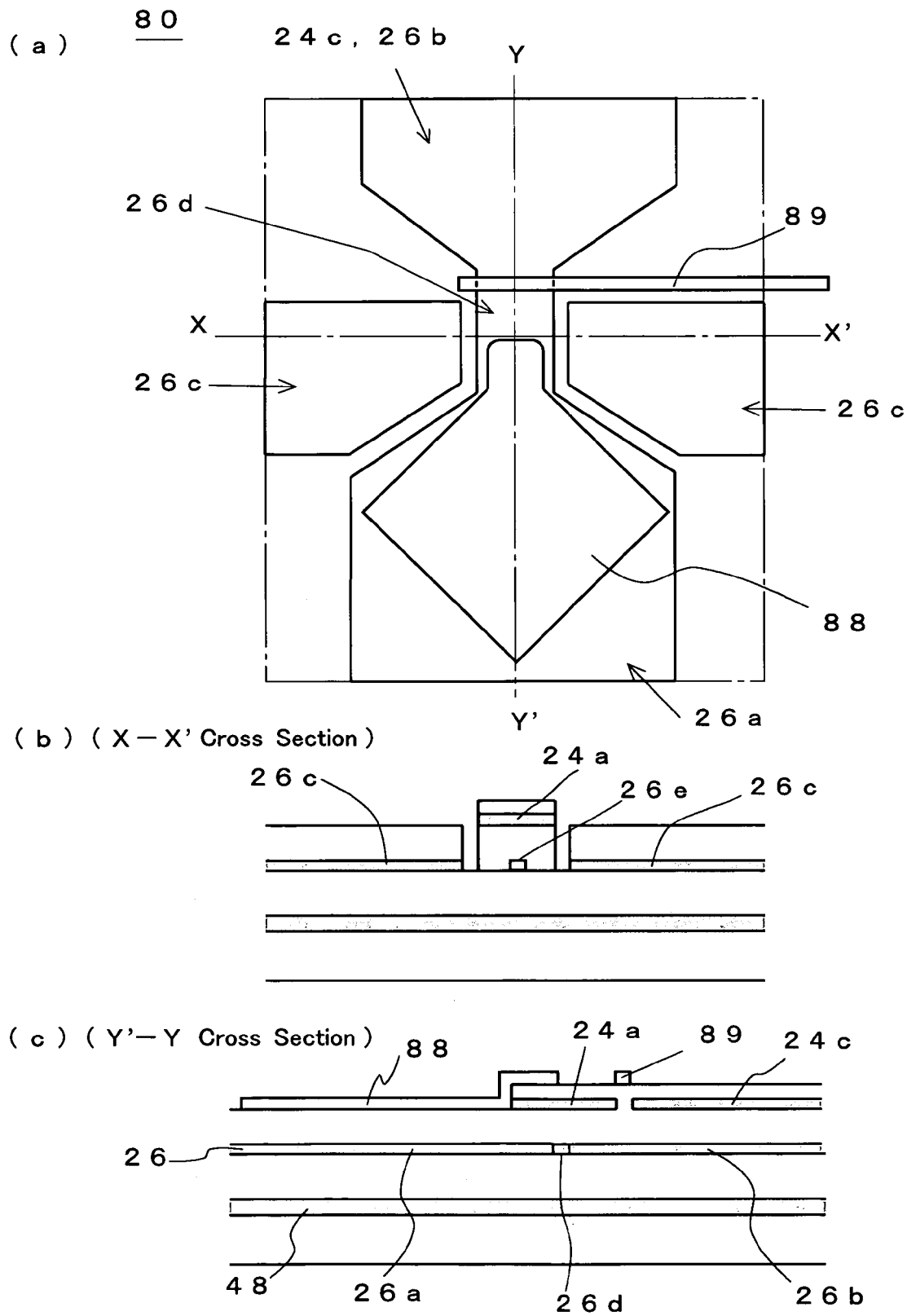
FIG. 21 illustrates a step that follows the step shown in FIG. 20 and illustrates how the infrared photodetector is constructed.

FIG. 21 shows a step that follows the step as shown in FIG. 20 and illustrates how the infrared photodetector 20 is constructed. FIG. 21(a) is a top view and FIGS. 21(b) and 21(c) are cross sectional views taken along the lines X-X' and Y'-Y in FIG. 21(a), respectively. A patch section 88 and a gate electrode 89 are formed by lift-off process using a metal thin film. The infrared photodetector 80 is completed by this process. The patch section 88 is configured and positioned as same as the infrared photodetector 20 shown in FIG. 9. As shown in FIG. 21(c), it is the same as with the infrared photodetector 50 shown in FIG. 17 that with the quantum dot 24a formed to be square, a negative bias is applied to the gate electrode 89 to form a potential barrier $U_B$ between the gate and escape electrodes 89 and 24c. FIG. 21(b) shows the state that the side gate electrodes 26c are biased negatively to pinch the joint 26d and thereby to form the point contact 26e, and FIG. 21(c) shows the state that the source electrode 26a connects to the drain electrode 26b via the point contact 26e. In this way, the infrared photodetector 80 differs from the infrared photodetector 70 according to the third form of implementation in that its point-contact transistor lies under the quantum dot 24a. Further, the microstrip antenna is made up of the patch section 88 and the conductive layer 48.

According to this structure, an infrared photon parallel to a plane of the patch section 88 is incident on the microstrip antenna to cause the resonance therewith, and its oscillatory electric field of a single infrared photon is converted to an oscillatory electric field in a z direction. An electron in the quantum dot 24a is allowed to absorb the oscillatory electric field in a z direction and thereby excited to a first excitation state subband. Then, its excitation energy is converted to energy in a direction in an x-y plane under the influences of random potential or lattice vibrations, and if the energy is higher than the potential barrier $U_B$ formed by the gate electrode 89, the electron is then set free to escape into the escape electrode 24c, thereby ionizing the quantum dot 24a. An electrical conductivity of the point contact 26e is varied by the ionized charge of the quantum dot 24a and the current flowing from the source electrode 26a to the drain electrode 26b is changed. An ionized state continuing long, the integral of change in current becomes a magnitude that can be detected, and sensitivity capable of detecting a single infrared photon can be achieved.

Next, arraying with an infrared photodetector 70 is explained. The substrate 51 as shown in FIG. 15 can be used.

Figure 22:
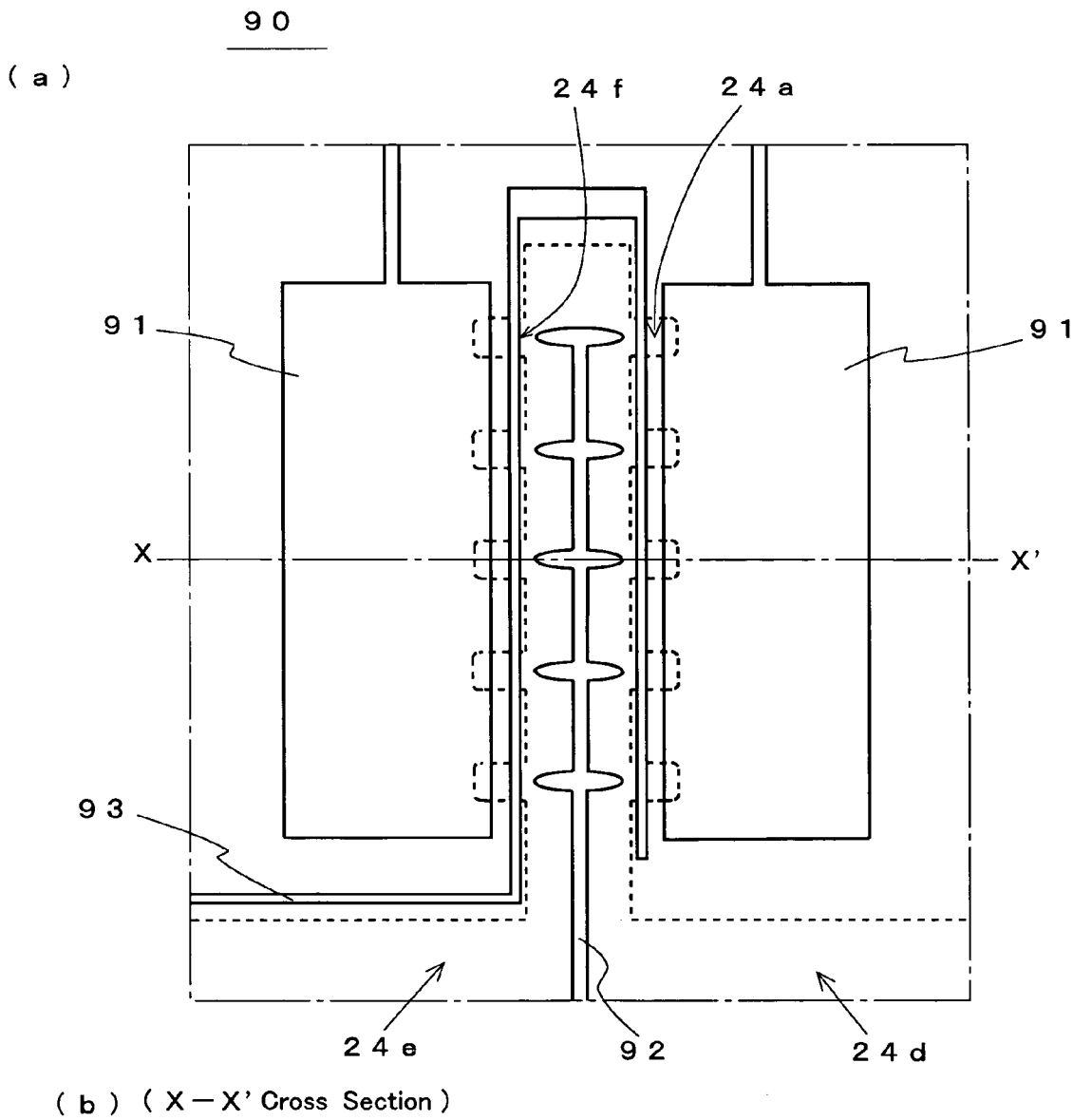
FIG. 22 illustrates an arrayed infrared photodetector using an infrared photodetector according to the forth form of implementation of the present invention.
Figure 22:
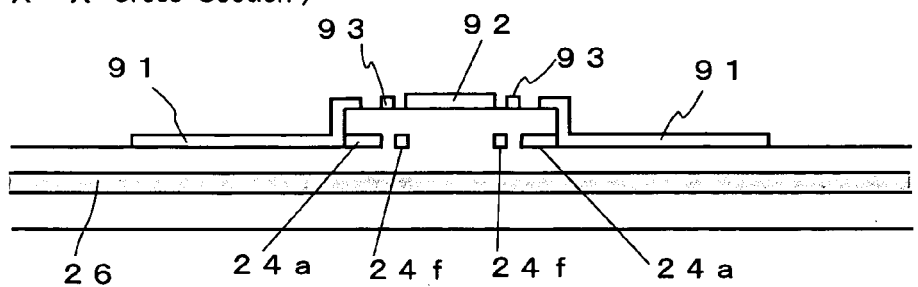

FIG. 22 shows an arrayed infrared photodetector 90 using the infrared photodetector 70, in which FIG. 22(a) is a top view thereof and FIG. 22(b) is a cross sectional view thereof taken along the line X-X' in FIG. 22(a). There are shown microstrip antenna patch sections 91, a gate electrode 92 that separates a source and a drain electrode as shown in FIG. 18 while forming point contacts, and gate electrodes 93 for forming quantum dots while forming an escaping potential barrier as shown in FIGS. 18, and 24d and 24e are a source and a drain electrodes as in FIG. 18. 24f is a point contact, and 24a is a quantum dot as shown in FIG. 18. The microstrip antenna is made up of the patch sections 91 and a two-dimensional electron layer 26. Such arraying can easily be made as same manner of fabricating the infrared photodetector 80.

An explanation is next given of a fifth form of implementation of the present invention.

Figure 23:
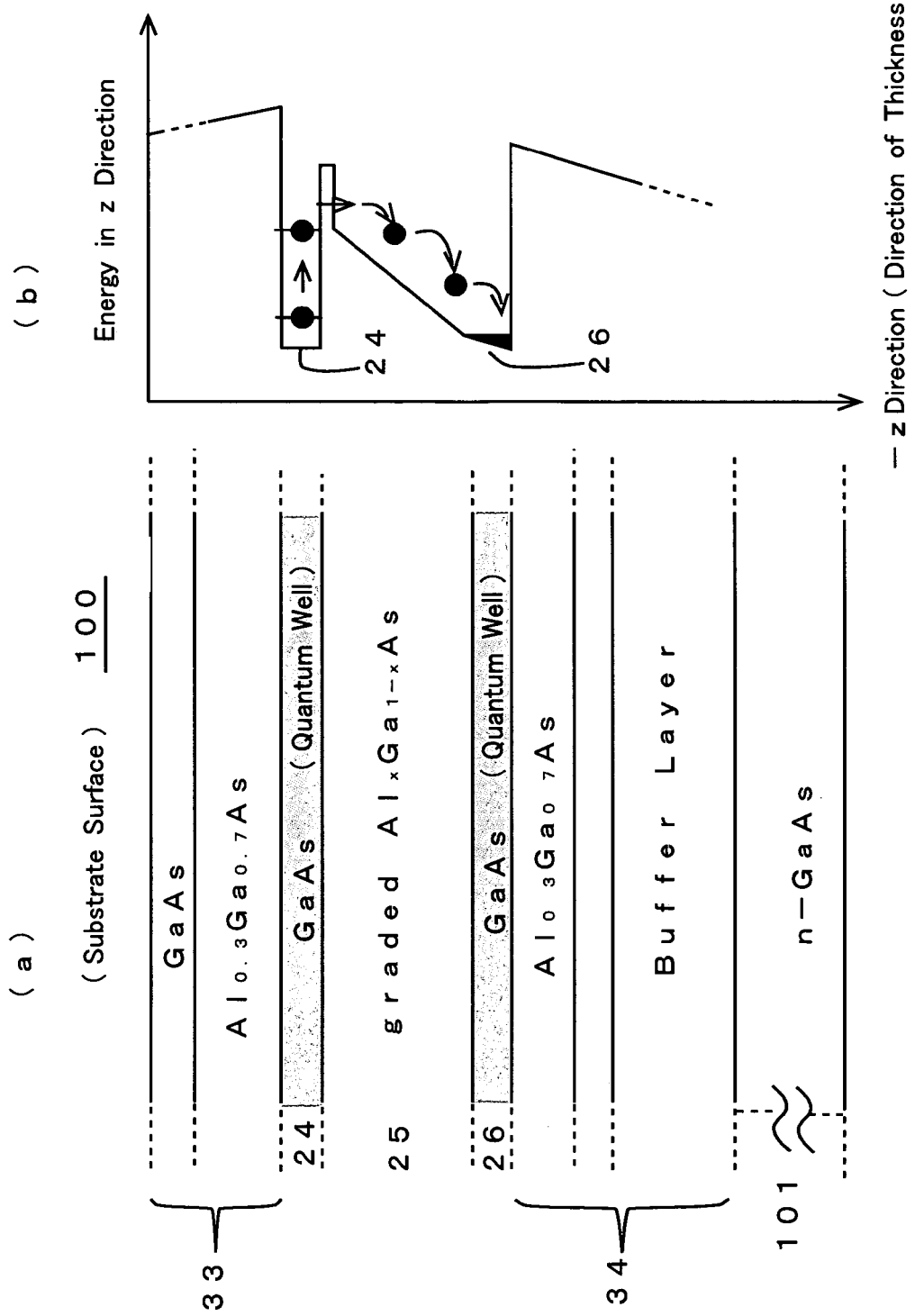
FIG. 23 illustrates a semiconductor multilayered heteroepitaxially grown substrate for use in an infrared photodetector according to a fifth form of implementation of the present invention.

FIG. 23 illustrates a semiconductor multilayered heteroepitaxially grown substrate 100 used in an infrared photodetector according to the fifth form of implementation. A two-dimensional electron layer 24 is used to form a quantum plate. A two-dimensional electron layer 26 is used as a two-dimensional electron layer for a point-contact network transistor. An intermediate layer 25 between the two-dimensional electron layers 24 and 26 is a gradient layer of $Al_xGa_{1-x}As$ whose composition ratio x varies gradually and designed so that an internal electric field by this composition gradient causes an electron that is injected into the intermediate layer 25 to fall into the two-dimensional electron layer 26 more quickly as shown in FIG. 23(b). A lower insulating layer 34 positioned below the two-dimensional electron layer 26 includes a buffer layer made of GaAs and has beneath it an n-GaAs layer 101 that is a GaAs conductive layer. The n-GaAs layer 101 is used as a back gate electrode for controlling the concentration of two-dimensional electrons in a two-dimensional electron layer of the point-contact network transistor.

Figure 24:
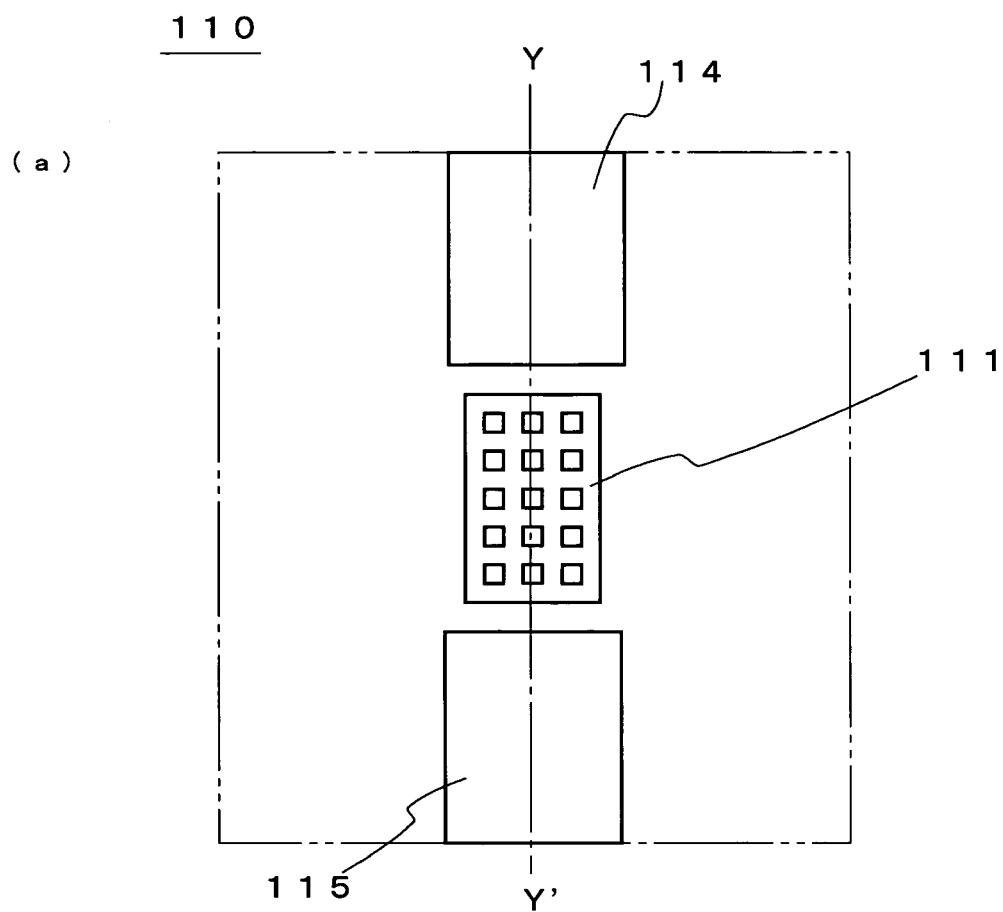
FIG. 24 illustrates the structure of an infrared photodetector according to the fifth form of the present invention.
Figure 24:
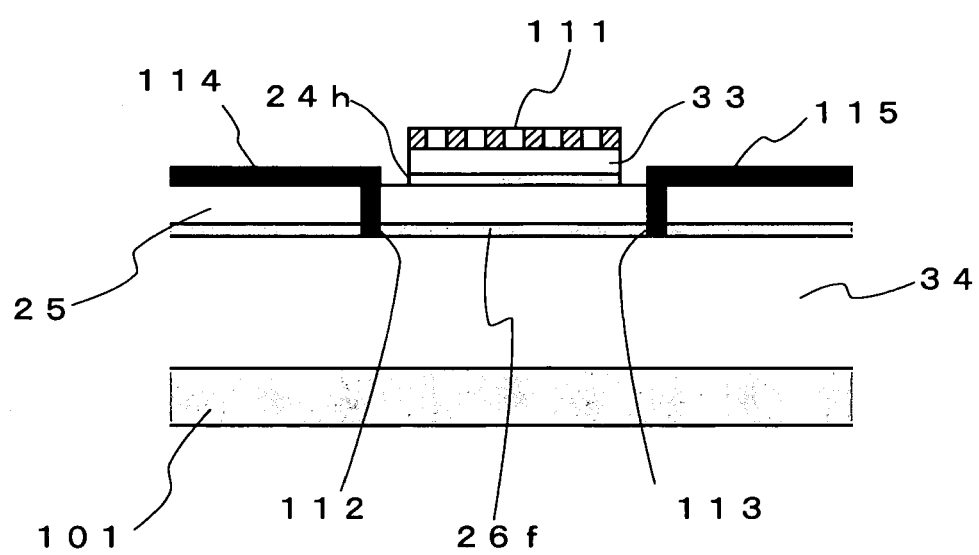

FIG. 24 illustrates the structure of an infrared photodetector 110 according to the fifth form of implementation of the present invention, in which FIG. 24(a) is a top view thereof and FIG. 24(b) is a cross sectional view thereof taken along the line Y-Y' in FIG. 24(a). The infrared photodetector 110 has a mesa structure comprising a metal lattice 111 as an arrangement of metal patches that individually act as a microstrip antenna, an upper insulating layer 33, a quantum plate 24h, an intermediate layer 25 and a two-dimensional electron layer 26f of the point-contact network transistor. The quantum plate 24h has an angular shape of a size larger than ½ of an infrared wavelength λ for detection, and the metal lattice 111 has an external shape identical to that of the quantum plate 24h and has a length L of each patch side: L=λ∈/2 where ∈ is an average dielectric constant between the upper insulating layer 33 and the intermediate layer 25. The two-dimensional electron layer 26f has its opposing two sides connected via ohmic contacts 112 and 113 to source and drain electrodes 114 and 115, respectively. A thin film of a metal such as Al may be used for each of the ohmic contacts 112 and 113 and the source and drain electrodes 114 and 115. The lower part of the two-dimensional electron layer 26f is connected via the lower insulating layer 34 to the back gate electrode 101 made of the n-GaAs layer 101. The two-dimensional electron layer 26f, the source and drain electrodes 114 and 115 and the back gate electrode 101 make up the point-contact network transistor. The infrared photodetector 110 as those of the first to fourth forms of implementation can be formed by mesa etching, vapor deposition of metal thin films and patterning of metal films by lift-off process.

According to this structure, a microstrip antenna array is made up of the metal lattice 111 and the two-dimensional electron layer 26f, and an oscillatory electric field component of incident infrared light formed perpendicular to a plane of the quantum plate 24h excites an electron in the quantum plate 24h to a subband. The electron excited to the subband is injected into the two-dimensional electron layer 26f of the point-contact network transistor and absorbed into the drain electrode 115. With a voltage applied to the back gate electrode 101, the two-dimensional electron layer 26f is held in a state immediately before it has two-dimensional electrons depleted, the state that the regions in which two-dimensional electrons in the two-dimensional electron layer 26f exist are networked with a large number of point contacts low in conductance distributed in the two-dimensional electron layer 26f, namely that electrons conduct through the point contacts network. Two-dimensional electrons in the two-dimensional electron layer 26f are generated by the electric field of ionized charge of the quantum plate 24h, these two-dimensional electrons increase the electron concentration in each point-contact region, thereby increasing rapidly the conductance of the two-dimensional electron layer 26f. The ionization of the quantum plate 24h lasting for a long time period, the integral of change in current arising from change in conductance during this time period becomes a magnitude than can be detected, and infrared light even of the intensity of a single photon level can be detected with high sensitivity. The point-contact network transistor of this infrared photodetector is easier to fabricate than the point-contact transistor.

Mention is next made of specific examples. Example 1 is a specific example according to the fifth form of implementation mentioned above.

Figure 25:
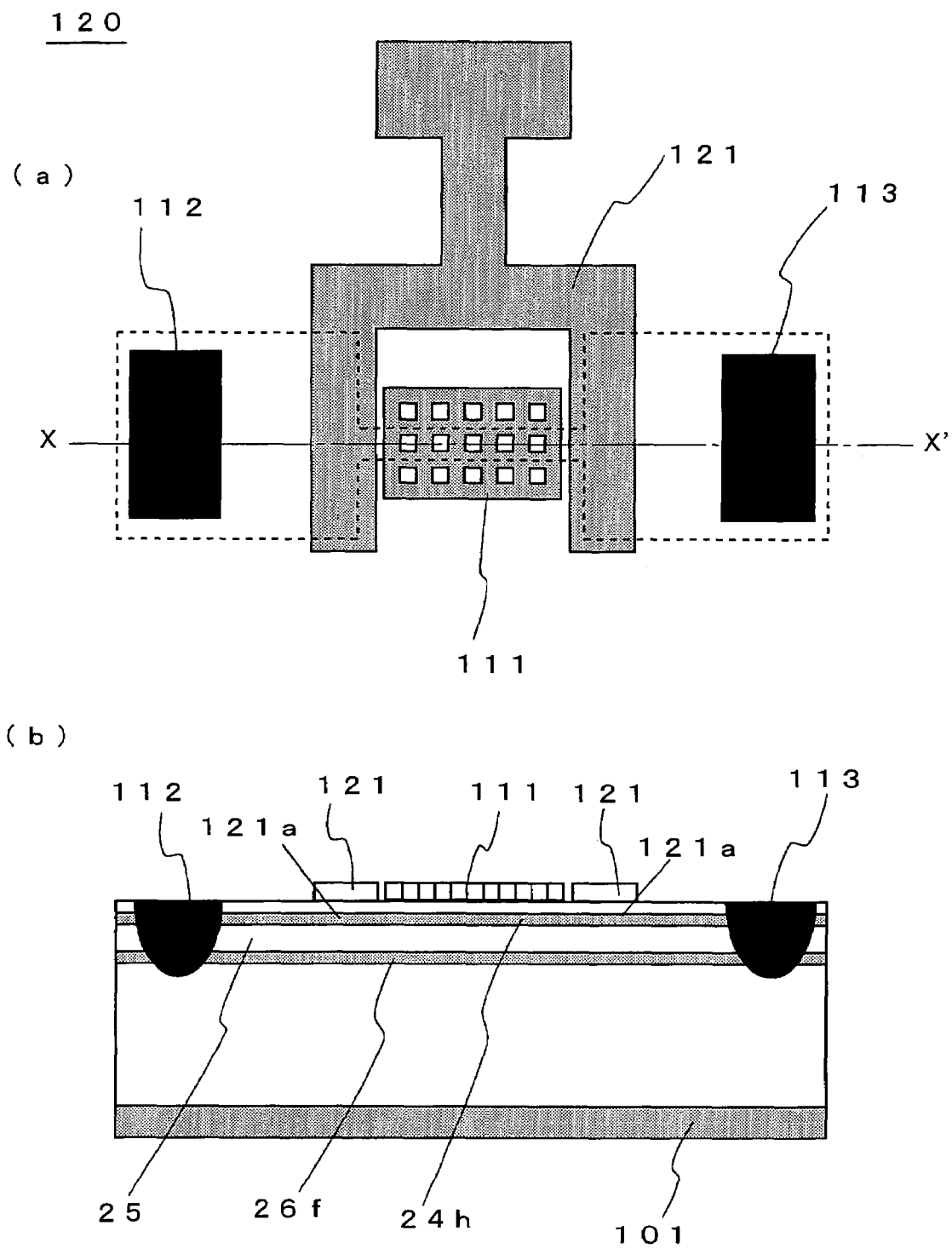
FIG. 25 illustrates the structure of an infrared photodetector used in Example 1 of the present invention.

FIG. 25 illustrates the structure of an infrared photodetector 120 used in Example 1. FIG. 25(a) is a top view thereof and FIG. 25(b) is a cross sectional view thereof taken along the line X-X' in FIG. 25(a). The infrared photodetector 120 differs from the infrared photodetector 110 as shown in FIG. 24 in that it uses an upper gate electrode 121. Specifically, while in the infrared photodetector 110 the quantum plate 24h is formed by mesa etching and thereby mechanically isolated, in the infrared photodetector 120 a negative voltage is applied to the upper gate electrode 121 to form a depleted layer 121a, thereby electrically isolating the quantum plate 24h from the two-dimensional electron layer 24. The quantum plate 24h has a thickness of 10 nm and has a length and width of 100 μm and 40 μm, respectively. The quantum plate 24h and the two-dimensional electron layer 26f are spaced apart from each other by a distance of 100 nm.

Figure 26:
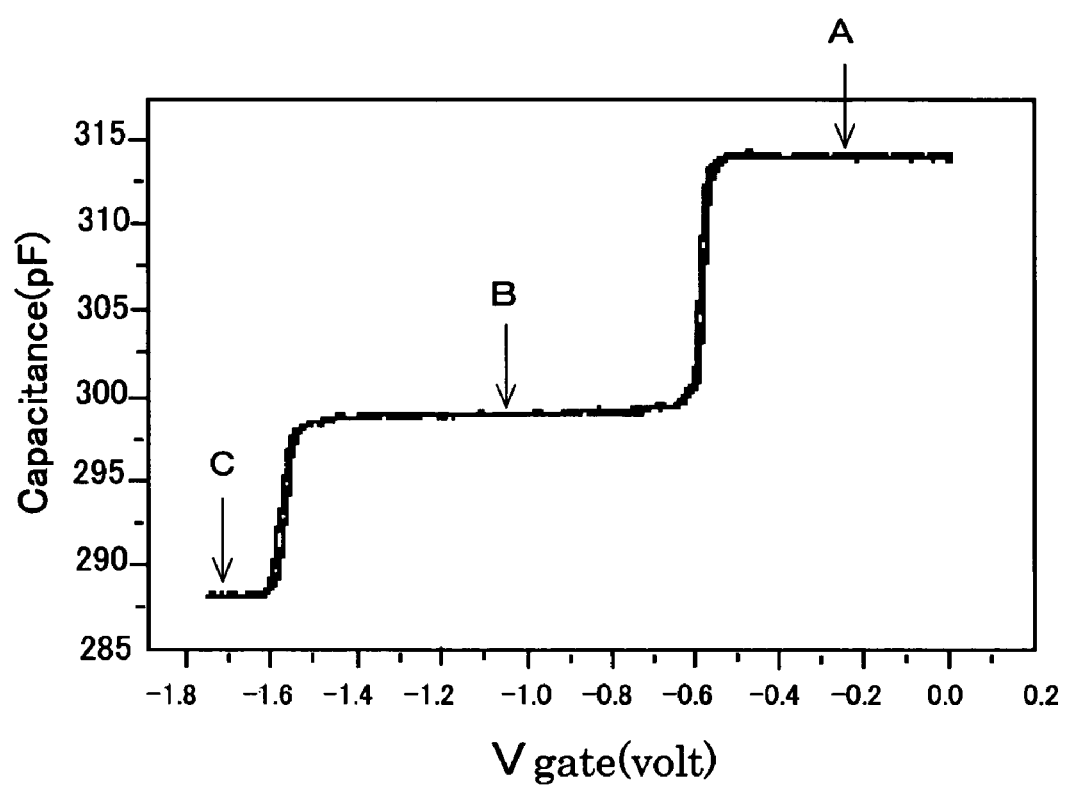
FIG. 26 is a graph showing the voltage ($V_{gate}$) dependency applied to the upper gate electrode of the capacitance between the upper gate electrode and the ohmic contact in the infrared photodetector.

FIG. 26 is a graph showing the voltage ($V_{gate}$) dependency applied to the upper gate electrode 121 of the capacitance between the upper gate electrode 121 and the ohmic contact 112 in the infrared photodetector 120. The ordinate axis represents the capacitance and the abscissa axis represents the $V_{gate}$ voltage. From FIG. 26, it is seen that with the $V_{gate}$ voltage of about −0.6 volt or more, a constant, maximum capacitance value is attained as shown at A in the graph. This indicates that the quantum plate 24h is not isolated from the two-dimensional electron layer 24 due to the absence of a depleted layer 121a. With the $V_{gate}$ voltage from about −0.6 volt to −1.6 volt, a constant, medium capacitance value is attained as shown at B in the graph. This indicates that the depleted layer 121a is fully formed to isolate the quantum plate 24h from the two-dimensional electron layer 24. With the $V_{gate}$ voltage of about −1.6 volt or less, a constant, minimum capacitance value as shown at C in the graph is attained. This indicates that the depleted layer 121a grows so large as to isolate not only the quantum plate 24h but also the two-dimensional electron layer 26f. From these results, it is seen that applying a negative voltage in the range shown by B in the graph to the upper gate electrode can form an infrared photodetector according to the fifth form of implementation having a quantum plate and a point-contact network transistor directly thereunder.

Mention is next made of a response of the infrared photodetector 120 to infrared light.

The infrared photodetector 120 was irradiated with an infrared light having a wavelength: λ=14.5 μm and the resistance between the ohmic contacts 112 and 113 was measured while varying the $V_{gate}$ voltage applied to the upper gate electrode 121.

Figure 27:
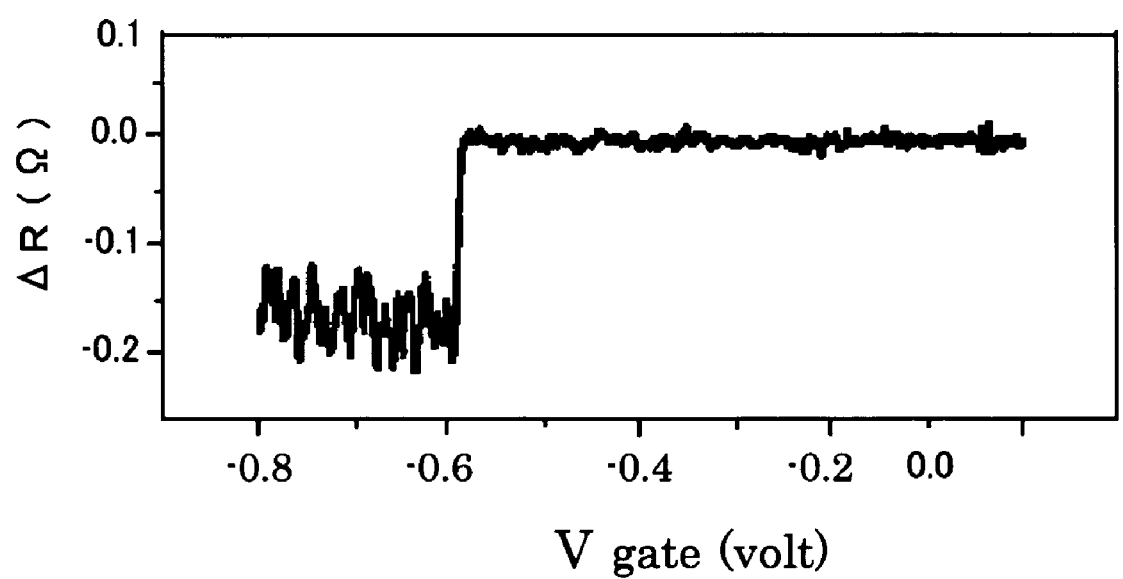
FIG. 27 is a graph illustrating a response to infrared light of an infrared photodetector of Example 1 of the present invention.

FIG. 27 is a graph showing a response of the infrared photodetector 120 to the infrared light. The ordinate axis represents change ΔR in the resistance between the ohmic contacts 112 and 113 with a reference taken if the infrared light is not incident. The abscissa axis represents the $V_{gate}$ voltage applied to the upper gate electrode 121. From the graph it is seen that with the $V_{gate}$ voltage of about −0.6 volt or more, ΔR is 0Ω and with the $V_{gate}$ voltage of about −0.6 volt to −0.8 volt, A R changes to about −0.15Ω. The results shown in FIG. 27 indicate that with a negative voltage in the range shown at B in FIG. 26 applied to the upper gate electrode, the quantum plate electrically isolated from surroundings and the point-contact network transistor was formed, an electron in the quantum plate 24h was excited by infrared light to the subband and then absorbed via the two-dimensional electron layer 26f into the drain electrode 115 to ionize the quantum plate 24h, and a charge by this ionization caused a rise in conductance of the two-dimensional electron layer 26f. To with, it is indicated that the infrared photodetector according to the fifth form of implementation was formed and as a result, the infrared light was detected. In this connection, it should be noted that a fluctuation of ΔR in the range of the about −0.6 volt to −0.8 volt is predicated on a black body radiation from the infrared light source receptacle.

Figure 28:
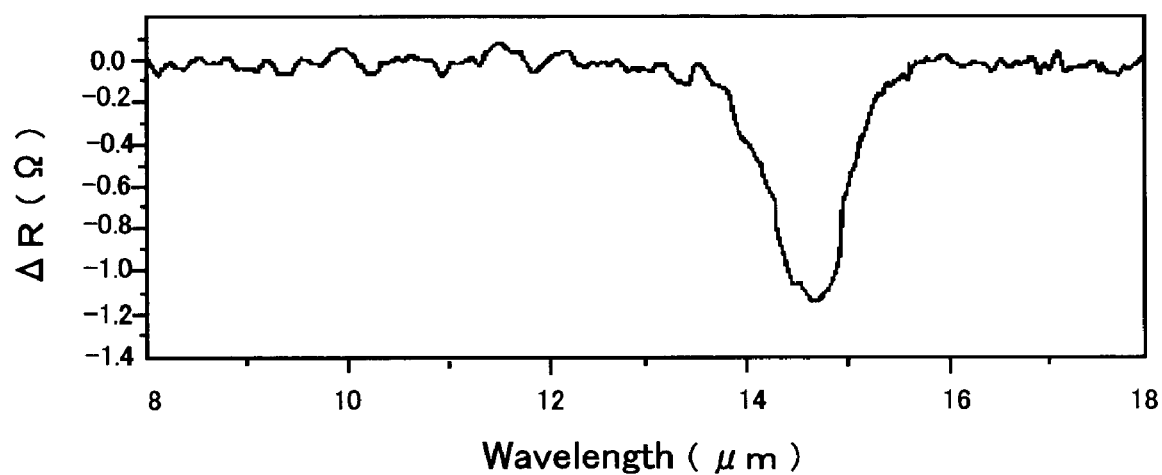
FIG. 28 is a graph illustrating infrared wavelength selection characteristics of an infrared photodetector of Example 1 of the present invention.

FIG. 28 is a graph illustrating infrared wavelength selection characteristics of the infrared photodetector 120. The ordinate axis represents ΔR and the abscissa axis represents the infrared wavelength. Measurements of ΔR were taken by changing incident infrared wavelength from 8 μm to 18 μm. From FIG. 28, it is seen that the infrared photodetector 120 selectively detects an infrared light of about 14.5 μm. Energy of an infrared light of 14.6 μm corresponds to an intersubband excitation energy of a GaAs layer of 10 nm thick, corresponding to the fact that the quantum plate 24h of this infrared photodetector is a GaAs layer of 10 nm thick.

Mention is next made of light sensitivity.

Measurements in the Example above were made upon guiding infrared light from an infrared light source held at room temperature (300 K) to the infrared photodetector 120 cooled to a low temperature (4.2 K). Consequently, the black body radiation from the receptacle of the infrared light source held at room temperature was incident on the infrared photodetector 120, and its intensity is about 16 times as large as that of the infrared light source. Thus, the measurements in the Example above are in the state that a large number of photons by black body radiation are incident and a large number of free electrons predicated on absorption of the black body radiation exist in the two-dimensional electron layer 26f, namely that the photon detection sensitivity of the infrared photodetector 120 is almost saturated.

Mention is next made of the fact that it is possible to detect a single photon by doing away with the black body radiation from the receptacle for an infrared light source and applying a back gate voltage to the back gate electrode 101. In the state that the infrared source receptacle is cooled and background noises by a black body radiation are removed, current I and resistance R of the two-dimensional electron layer 26f are expressed by equations as follows:

$$I = ne\mu W(V/L) \quad (9)$$

$$R = (L/W)(1/ne\mu) \quad (10)$$

where n: concentration of free electrons, e: electron charge, μ: electron mobility, W: channel width, L: channel length, and V: voltage applied between the source and drain electrodes.

By Δn number of infrared light excitations, Δn number of electrons are set free to escape from the quantum plate 24h. Assuming that the quantum plate 24h is charged with Q=Δne, changes in current I and resistance R, ΔI and ΔR, of the two-dimensional electron layer 26f can be expressed by equations as follows:

$$\Delta I = \Delta ne\mu W(V/L) \quad (11)$$

$$\Delta R = (L/W)(1/\Delta ne\mu) \quad (12)$$

Measured by using an infrared photodetector with a quantum plate of 50 μm×200 μm in size and cooling the infrared photodetector to 4.2 K to do away with the black body radiation, in a state that the back gate voltage is not applied and with a time constant of 300 msec, the value of detection limit (K=ΔI/I=ΔR/R) was K=3×10⁻⁶. Since under these measurement conditions the free electron concentration n was 2.1×10¹⁵/m², finding ΔN (ΔN=nLW×ΔI/I) gives rise to ΔN≈100.

Since making the quantum plate size smaller increases change in electrostatic potential of the two-dimensional electron layer relative to the same charge by ionization Q=eΔn, reducing the quantum plate size to about 10 μm×10 μm can gives rise to ΔN=10 or around 10.

Next, mention is made of a method of reducing the detection limit number ΔN further by applying the back gate voltage.

Figure 29:
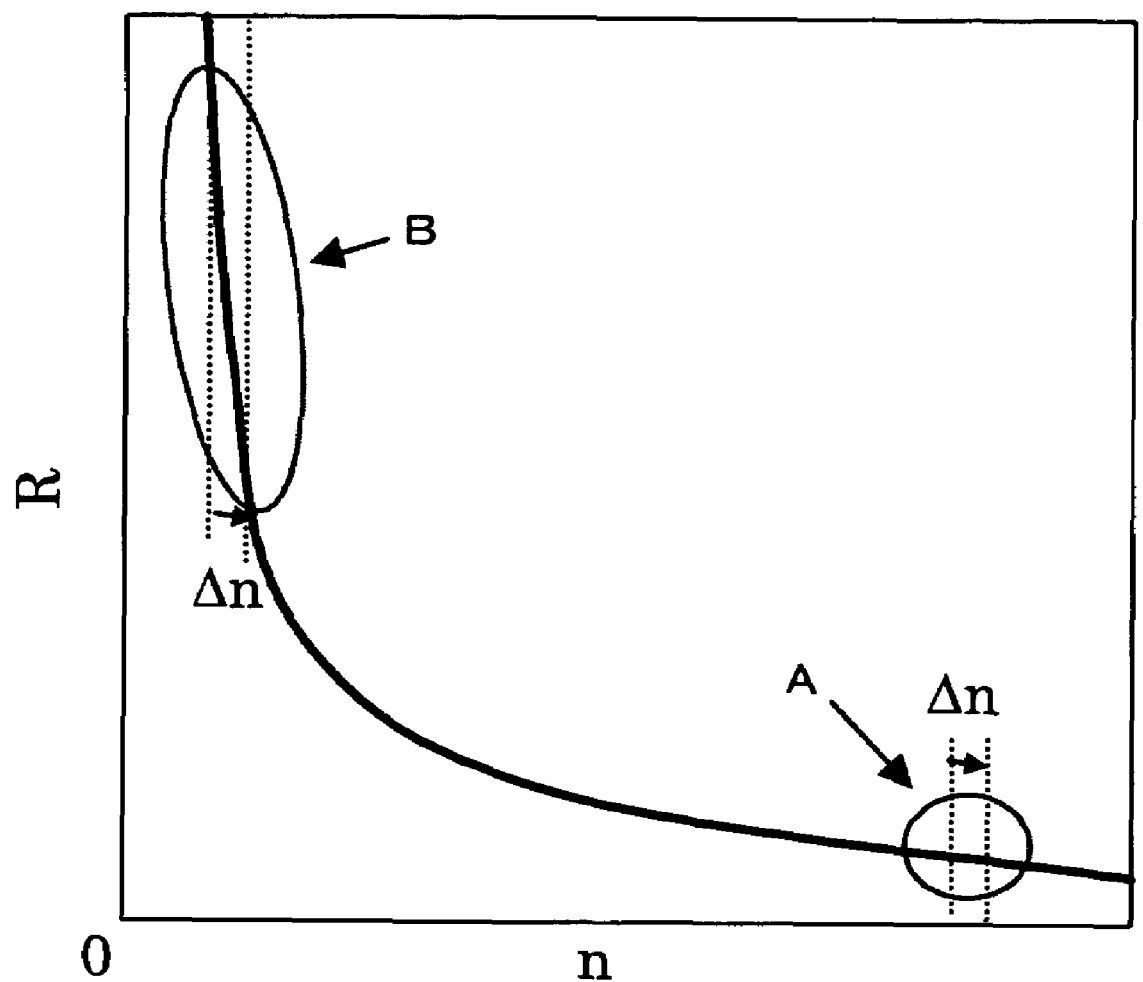
FIG. 29 is a graph showing a relationship between free electron concentration n and resistance R of the two-dimensional electron layer.

FIG. 29 is a graph showing the relationship between free electron concentration n and resistance R of the two-dimensional electron layer 26f. In a region where n is large, change in R relative to escape electron number Δn is small as indicated at A in the graph while in a region where free electron concentration n is small (n<0.5×10¹⁵/m²), change in resistance R relative to Δn becomes drastically large since electron mobility μ is also then a function of n as indicated at B in the graph. The measurements in which the back gate voltage is not applied correspond to those shown at A in the graph. Thus, reducing the quantum plate size to about 10 μm×10 μm while applying the back gate voltage to measure in the state of B in the graph permits giving rise to the number of detection limit ΔN being 1. Also, without reducing the quantum plate in size, applying a large negative voltage to the back gate electrode layer 101 to further lower the electron concentration n than the region B in the graph and thereby to make an electron concentration prior to depletion can realize the number of detection limit ΔN=1.

Figure 30:
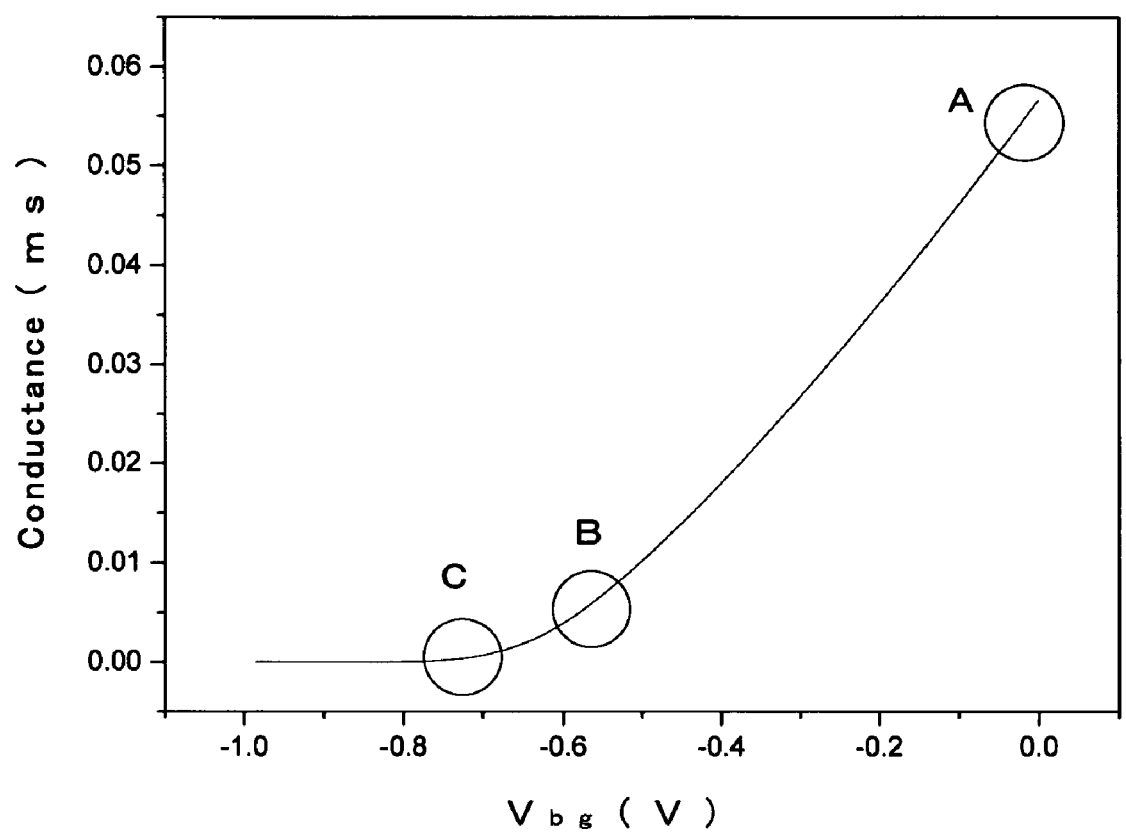
FIG. 30 is a graph showing dependence of the conductance of an infrared photodetector on the back gate voltage Vbg.

FIG. 30 is a graph showing dependence of the conductance of an infrared photodetector on the back gate voltage Vbg. Another infrared photoconductor that is equivalent in structure to the infrared photodetector 120 was used with the infrared source receptacle cooled to 4.2 K to make measurements. The free electron concentrations at A and B in the graph correspond to those at A and B in the graph of FIG. 29 and the electron concentration at C corresponds to that immediately prior to depletion ($n \approx 0.5 \times 10^{14}/m^2$). It is therefore seen that by applying a back gate voltage of around −0.7 volts, the electron concentration immediately prior to depletion can be realized.

Figure 31:
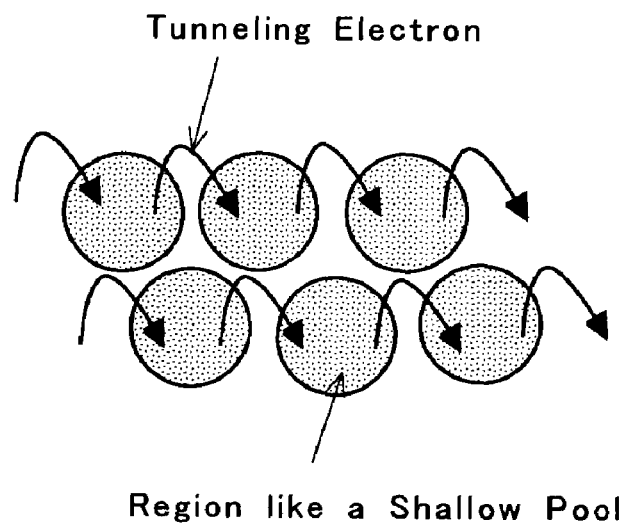
FIG. 31 diagrammatically illustrates current transport phenomena in a two-dimensional electron layer of an electron concentration immediately prior to depletion.
Figure 31:
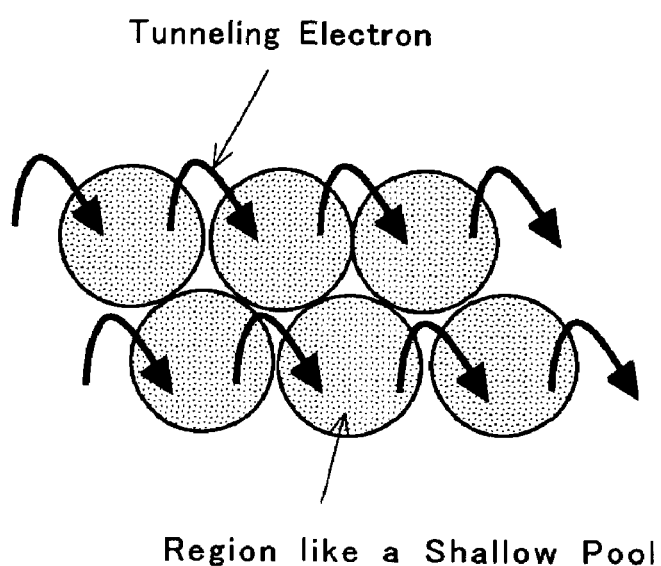
Figure 32:
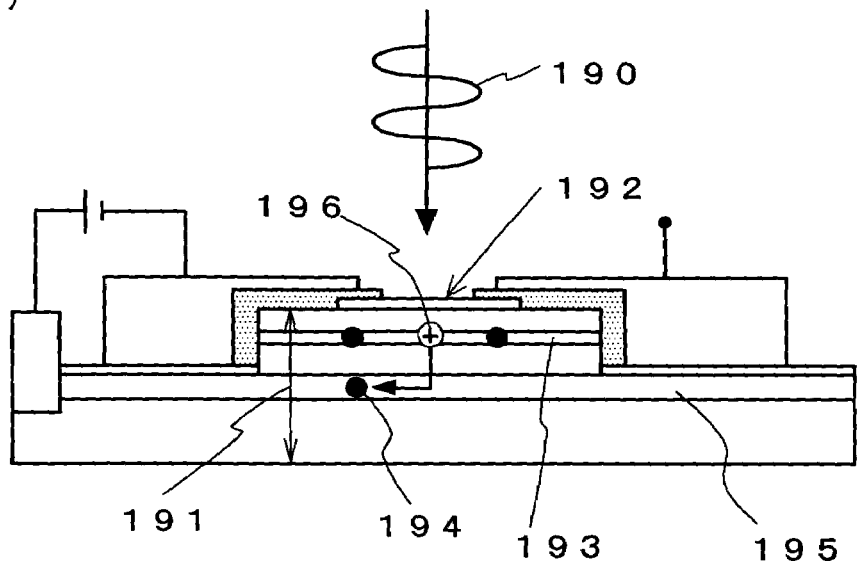
FIG. 32 diagrammatically illustrates the prior art.
Figure 32:
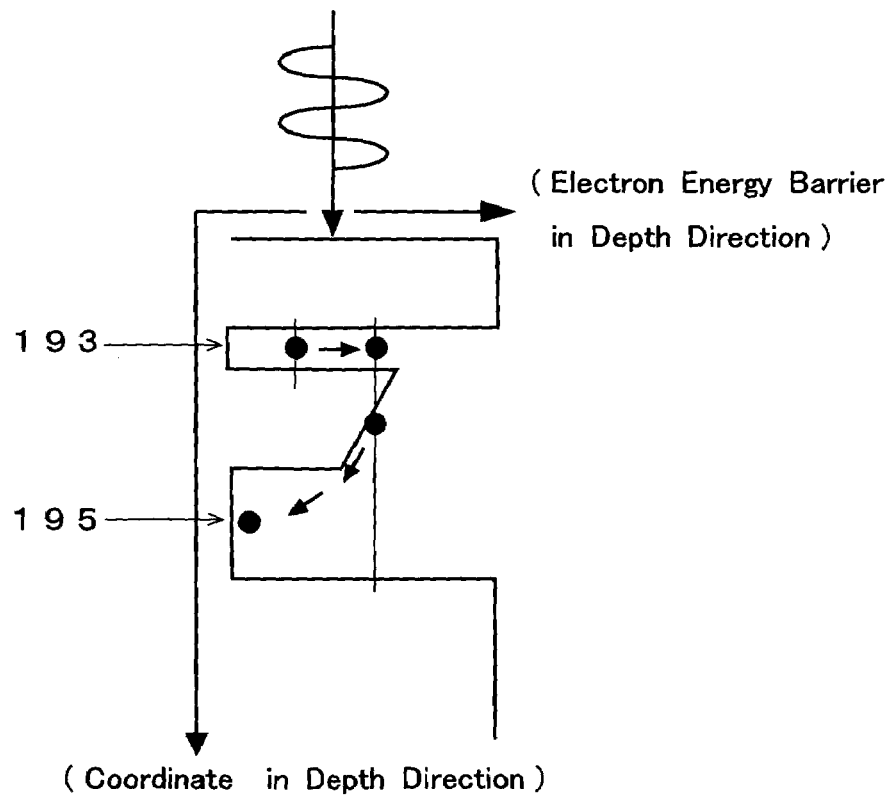

FIG. 31 diagrammatically illustrates current transport phenomena in a two-dimensional electron layer of an electron concentration immediately prior to depletion. In the two-dimensional electron layer of an electron concentration prior to depletion, there exist from place to place under random potential of doping impurities regions like shallow pools of around 0.1 μm to 0.5 μm in diameter in which the electrons slightly remain and through which electrons migrate by tunneling transition to form currents as shown in FIG. 31(a). With the two-dimensional electron layer irradiated with infrared light to ionize a quantum plate thereon, however, these regions change their size based on charge by this ionization so that the probability of tunneling between them is markedly altered (this effect is called a point-contact network transistor) with the result that extraordinarily larger change in current than in the areas A and B of free electron concentrations is obtained. It is thus easily realized to obtain sensitivity to detect a limit of detection in number $\Delta N=1$, namely a single photon.

INDUSTRIAL APPLICABILITY

As described in the foregoing, an infrared photodetector according to the present invention is higher in sensitivity than the conventional infrared photodetector and can detect even a single infrared photon. And, since its structure and method of fabrication are simple, the photodetector can be realized as a detector suitable for arraying. Accordingly, it is extremely useful when used in a technical field of measurement where highly sensitive detection of infrared light is required and in an industrial field where video signals by infrared light are required.

What is claimed is:

1. An infrared photodetector comprising:
   an isolated two-dimensional electron layer electrically isolated from its surroundings for creating electrons excited upon absorbing incident infrared photons,
   means for focusing the incident infrared photons upon said isolated two-dimensional electron layer,
   means for setting free the electrons excited by absorbing the infrared light to escape from said isolated two-dimensional electron layer, thereby to charge said isolated two-dimensional electron layer, and
   a charge sensitive transistor in which change in current occurs when said isolated two-dimensional electron layer is charged and is maintained while said isolated two-dimensional electron layer is being charged,
   characterized in that said infrared photodetector includes means for focusing incident infrared photons upon said isolated two-dimensional electron layer and further for creating an oscillatory electric field component for incident infrared photons, perpendicular to a plane of the isolated two-dimensional electron layer, thereby selectively bringing about a two-dimensional intersubband excitation for electrons in said isolated two-dimensional electron layer.

2. The infrared photodetector as set forth in claim 1, characterized in that:
   said isolated two-dimensional electron layer comprises a quantum dot;
   said means for selectively bringing about said two-dimensional intersubband excitation comprises a microstrip antenna laid across said quantum dot;
   said means to charge said isolated two-dimensional electron layer comprises a tunnel baffler layer arranged at an underside of said quantum dot and a source and a drain electrode of a point-contact transistor arranged at an underside of said tunnel barrier layer; and
   said charge sensitive transistor comprises said point-contact transistor.

3. The infrared photodetector as set forth in claim 2, characterized in that said point-contact transistor comprises a two-dimensional electron layer, a gate electrode whereby an area in which two-dimensional electrons exist in said two-dimensional electron layer is pinched to a submicron size, and a source and a drain electrode connecting to a point as said area of two-dimensional electrons existing that is to be pinched to a submicron size.

4. The infrared photodetector as set forth in claim 1, characterized in that:
   said isolated two-dimensional electron layer comprises a quantum dot;
   said means for selectively bringing about said two-dimensional intersubband excitation comprises a microstrip antenna laid across said quantum dot;
   said means to charge said isolated two-dimensional electron layer comprises a gate electrode disposed laterally in a in-plane direction of said quantum dot and an escape electrode disposed laterally to said gate electrode; and
   said charge sensitive electrode comprises a single-electron transistor arranged directly above said quantum dot.

5. The infrared photodetector as set forth in claim 1, characterized in that
   said isolated two-dimensional electron layer comprises a quantum dot;
   said means for selectively bringing about said two-dimensional intersubband excitation comprises a microstrip antenna laid across said quantum dot;
   said means to charge said isolated two-dimensional electron layer comprises a gate electrode disposed laterally in a in-plane direction of said quantum dot and an escape electrode disposed laterally to said gate electrode; and
   said charge sensitive electrode comprises a point-contact transistor laid laterally of said gate electrode.

6. The infrared photodetector as set forth in claim 5, characterized in that said point-contact transistor comprises a two-dimensional electron layer, a gate electrode whereby an area in which two-dimensional electrons exist in said two-dimensional electron layer is pinched to a submicron size, and a source and a drain electrode connecting to a point as said area of two-dimensional electrons existing that is to be pinched to a submicron size.

7. The infrared photodetector as set forth in claim 1, characterized in that
   said isolated two-dimensional electron layer comprises a quantum dot;
   said means for selectively bringing about said two-dimensional intersubband excitation comprises a microstrip antenna laid across said quantum dot;
   said means to charge said isolated two-dimensional electron layer comprises a gate electrode disposed laterally in a in-plane direction of said quantum dot and an escape electrode disposed laterally to said gate electrode; and
   said charge sensitive transistor comprises a point-contact transistor laid directly below said quantum dot.

8. The infrared photodetector as set forth in claim 7, characterized in that said point-contact transistor comprises a two-dimensional electron layer, a gate electrode whereby an area in which two-dimensional electrons exist in said two-dimensional electron layer is pinched to a submicron size, and a source and a drain electrode connecting to a point as said area of two-dimensional electrons existing that is to be pinched to a submicron size.

9. The infrared photodetector as set forth in claim 1, characterized in that
- said isolated two-dimensional electron layer comprises a quantum plate;
- said means for selectively bringing about said two-dimensional intersubband excitation comprises a microstrip antenna laid across said quantum plate;
- said means to charge said isolated two-dimensional electron layer comprises a tunnel baffler layer arranged at an underside of said quantum plate and a two-dimensional electron layer of a point-contact network transistor arranged beneath said quantum dot via said tunnel barrier layer intervening; and
- said charge sensitive transistor comprises said point-contact network transistor.

10. The infrared photodetector as set forth in claim 9, characterized in that said point-contact network transistor comprises a two-dimensional electron layer, a back gate electrode whereby said two-dimensional electron layer is depleted immediately prior to its depletion for forming a network constituted of point contacts as areas of two-dimensional electrons existing which are pinched to a submicron size, and a source and a drain electrode connecting to both ends of said two-dimensional electron layer, respectively.

11. The infrared photodetector as set forth in claim 1, characterized in that said isolated two-dimensional electron layer, said means for selectively bringing about said two-dimensional intersubband excitation, said means to charge said isolated two-dimensional electron layer and said charge sensitive transistor are formed of a single semiconductor multilayered heteroepitaxially grown substrate.

12. An infrared photodetector, characterized in that such photodetectors as set forth in any one of claims 1 to 10, 6, 8 are connected together in the form of a series array.

13. An infrared photodetector, characterized in that such photodetectors as set forth in any one of claims 1 to 10, 6, 8 are connected together in the form of a two-dimensional matrix.

* * * * *